(12) United States Patent
Yang

(10) Patent No.: US 12,525,580 B2
(45) Date of Patent: Jan. 13, 2026

(54) SEMICONDUCTOR PACKAGE AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 595 days.

(21) Appl. No.: 18/060,573

(22) Filed: Dec. 1, 2022

(65) Prior Publication Data
US 2024/0186288 A1 Jun. 6, 2024

(51) Int. Cl.
| | |
|---|---|
| *H01L 25/065* | (2023.01) |
| *H01L 21/48* | (2006.01) |
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |
| *H01L 25/00* | (2006.01) |

(52) U.S. Cl.
CPC ........ *H01L 25/0657* (2013.01); *H01L 21/486* (2013.01); *H01L 21/56* (2013.01); *H01L 23/3128* (2013.01); *H01L 23/49811* (2013.01); *H01L 23/5383* (2013.01); *H01L 23/5384* (2013.01); *H01L 24/32* (2013.01); *H01L 24/48* (2013.01); *H01L 24/73* (2013.01); *H01L 25/50* (2013.01); *H01L 2224/32225* (2013.01); *H01L 2224/48225* (2013.01); *H01L 2224/73215* (2013.01)

(58) Field of Classification Search
CPC .... H01L 25/0657; H01L 21/486; H01L 21/56
See application file for complete search history.

(56) References Cited

U.S. PATENT DOCUMENTS

| | | | | |
|---|---|---|---|---|
| 6,020,629 A | * | 2/2000 | Farnworth | H01L 24/06 257/781 |
| 2015/0200183 A1 | * | 7/2015 | Haba | H01L 25/0655 257/774 |
| 2020/0286856 A1 | * | 9/2020 | Lee | H01L 23/5386 |

FOREIGN PATENT DOCUMENTS

TW 201342546 A 10/2013

* cited by examiner

*Primary Examiner* — Errol V Fernandes
(74) *Attorney, Agent, or Firm* — CKC & Partners Co., LLC

(57) ABSTRACT

A semiconductor package includes a first substrate, a first semiconductor chip, a first bonding wire, a second substrate, a second semiconductor chip and a second bonding wire. The first substrate has a window through a center portion of the first substrate. The first semiconductor chip is located on the first substrate. The first bonding wire is in the window of the first substrate and electrically connects to the first semiconductor chip and the first substrate. The second substrate is located on the first semiconductor chip, and has a window through a center portion of the second substrate. The second substrate electrically connects to the first substrate. The second semiconductor chip is located on the second substrate. The second bonding wire is in the window of the second substrate and electrically connects to the second semiconductor chip and the second substrate.

18 Claims, 26 Drawing Sheets

SEMICONDUCTOR PACKAGE AND MANUFACTURING METHOD THEREOF

BACKGROUND

Field of Disclosure

The present disclosure relates to a semiconductor package and a manufacturing method of the semiconductor package.

Description of Related Art

As the data rate of DRAM (dynamic random access memory) rises significantly while entering the era of DDR5 SDRAM (double data rate fifth-generation synchronous DRAM). The data rate is going to rise up to 8000 MHz (Mega Hertz). A traditional wBGA (window ball grid array) package with single DRAM chip is not capable to work at such high data rate.

One of the general solutions is to use high stacked package DRAM, in which multiple DRAM chips are electrically connects and packaged. However, when using the traditional wBGA method, the bonding pad of the first semiconductor chip faces down. To stack up a second semiconductor chip, the bonding pad of the second semiconductor chip has to face up. This would cause a swap between the bonding pad on the left side and the bonding pad on the right side, such that when the bonding wires are attached to the second semiconductor chip and a substrate that is below the first semiconductor chip, the bonding wire on the right side of the substrate has to connect to the bonding pad on the left side of the second semiconductor chip, and vice versa, which means that there is a cross between the bonding wires. The cross of the bonding wires would results in a high possibility of short between the bonding wires.

SUMMARY

One aspect of the present disclosure provides a semiconductor package.

According to one embodiment of the present disclosure, a semiconductor package includes a first substrate, a first semiconductor chip, a first bonding wire, a second substrate, a second semiconductor chip and a second bonding wire. The first substrate has a window through a center portion of the first substrate. The first semiconductor chip is located on the first substrate, and the first semiconductor chip has a bonding pad. The first bonding wire is in the window of the first substrate and electrically connects to the bonding pad of the first semiconductor chip and the first substrate. The second substrate is located on the first semiconductor chip, and has a window through a center portion of the second substrate. The second substrate electrically connects to the first substrate. The second semiconductor chip is located on the second substrate, and the second semiconductor chip has a bonding pad. The second bonding wire is in the window of the second substrate and electrically connects to the bonding pad of the second semiconductor chip and the second substrate.

In some embodiment of the present disclosure, the semiconductor package further includes a molding compound having a first portion and a second portion. The first portion of the molding compound is located on a top surface of the first substrate and covering the second substrate and the second semiconductor chip, and the second portion of the molding compound is located in the window of the first substrate and extends to a bottom surface of the first substrate.

In some embodiment of the present disclosure, the semiconductor package further includes a first bottom conductive foil and a second bottom conductive foil. The first bottom conductive foil is located on a bottom surface of the first substrate. The first bottom conductive foil electrically connects to the bonding pad of the first semiconductor through the first bonding wire. The second bottom conductive foil is located on a bottom surface of the second substrate. The second bottom conductive foil electrically connects to the bonding pad of the second semiconductor chip through the second bonding wire.

In some embodiment of the present disclosure, the semiconductor package further includes a first top conductive foil, a second top conductive foil and a third bonding wire. The first top conductive foil is located on a top surface of the first substrate. The second top conductive foil is located on a top surface of the second substrate. The third bonding wire electrically connects to the second top conductive foil and the first top conductive foil.

In some embodiment of the present disclosure, the first substrate further includes a conductive via, a conductive region and a solder ball. The conductive via is located in the first substrate and through the top surface of the first substrate and the bottom surface of the first substrate. The conductive via electrically connects to the first bottom conductive foil and the first top conductive foil. The conductive region is located on the bottom surface of the first substrate and electrically connects to a bottom end of the conductive via. The solder ball is located on the conductive region.

In some embodiment of the present disclosure, the second substrate further includes a conductive via. The conductive via is located in the second substrate and through the top surface of the second substrate and the bottom surface of the second substrate. The conductive via electrically connects to the second bottom conductive foil and the second top conductive foil.

In some embodiment of the present disclosure, the semiconductor package further includes an adhesive structure located on a top surface of the first substrate and extends to a bottom surface of the second semiconductor chip. The adhesive structure includes a first adhesive layer located between the first substrate and the first semiconductor chip, a second adhesive layer between the first substrate and the second substrate, between the first semiconductor chip and the second substrate, and in the window of the second substrate, and a third adhesive layer between the second substrate and the second semiconductor chip.

In some embodiment of the present disclosure, the second adhesive layer of the adhesive structure surrounds the first semiconductor chip and has an edge aligned with an edge of the second substrate.

In some embodiment of the present disclosure, the semiconductor package further includes a third substrate, a third semiconductor chip, a fourth bonding wire, a fourth substrate, a fourth semiconductor chip and a fifth bonding wire. The third substrate is located on the second semiconductor chip, and has a window through a center portion of the third substrate. The third substrate electrically connects to the first substrate. The third semiconductor chip is located on the third substrate. The third semiconductor chip has a bonding pad. The fourth bonding wire is in the window of the third substrate and electrically connects to the bonding pad of the third semiconductor chip and the third substrate. The fourth substrate is located on the third semiconductor chip, and has a window through a center portion of the fourth substrate. The fourth substrate electrically connects to the first substrate. The fourth semiconductor chip is located on the fourth substrate. The fourth semiconductor chip has a bonding pad. The fifth bonding wire is in the window of the fourth substrate and electrically connects to the bonding pad of the fourth semiconductor chip and the fourth substrate.

In some embodiment of the present disclosure, the semiconductor package further includes a third bottom conductive foil and a fourth bottom conductive foil. The third bottom conductive foil is located on a bottom surface of the third substrate. The third bottom conductive foil electrically connects to the bonding pad of the third semiconductor chip through the fourth bonding wire. The fourth bottom conductive foil is located on a bottom surface of the fourth substrate. The fourth bottom conductive foil electrically connects to the bonding pad of the fourth semiconductor chip through the fifth bonding wire.

In some embodiment of the present disclosure, the semiconductor package further includes a third top conductive foil and a conductive via. The third top conductive foil is located on a top surface of the third substrate. The third top conductive foil electrically connects to the first substrate through a sixth bonding wire. The conductive via is located in the third substrate and through the top surface of the third substrate and the bottom surface of the third substrate. The conductive via electrically connects to the third bottom conductive foil and the third top conductive foil.

In some embodiment of the present disclosure, the semiconductor package further includes a fourth top conductive foil and a conductive via. The fourth top conductive foil is located on a top surface of the fourth substrate. The fourth top conductive foil electrically connects to the first substrate through a seventh bonding wire. The conductive via is located in the fourth substrate and through the top surface of the fourth substrate and the bottom surface of the fourth substrate. The conductive via electrically connects to the fourth bottom conductive foil and the fourth top conductive foil.

In some embodiment of the present disclosure, the semiconductor package further includes an adhesive structure located on a top surface of the first substrate and extends to a bottom surface of the fourth semiconductor chip. The adhesive structure includes a first adhesive layer located between the first substrate and the first semiconductor chip, a second adhesive layer between the first substrate and the second substrate, between the first semiconductor chip and the second substrate, and in the window of the second substrate, a third adhesive layer between the second substrate and the second semiconductor chip, a fourth adhesive layer between the second substrate and the third substrate, between the second semiconductor chip and the third substrate, and in the window of the third substrate, a fifth adhesive layer between the third substrate and the third semiconductor chip, a sixth adhesive layer between the third substrate and the fourth substrate, between the third semiconductor chip and the fourth substrate, and in the window of the fourth substrate, and a seventh adhesive layer between the fourth substrate and the fourth semiconductor chip.

In some embodiment of the present disclosure, the second adhesive layer of the adhesive structure surrounds the first semiconductor chip and has an edge aligned with an edge of the second substrate, the fourth adhesive layer of the adhesive structure surrounds the second semiconductor chip and has an edge aligned with an edge of the third substrate, and the sixth adhesive layer of the adhesive structure surrounds the third semiconductor chip and has an edge aligned with an edge of the fourth substrate.

One aspect of the present disclosure provides a manufacturing method of a semiconductor package.

According to one embodiment of the present disclosure, a manufacturing method of a semiconductor package includes: forming a window through a center portion of a first substrate; attaching a first surface of the first substrate to a first surface of a first semiconductor chip; electrically connecting, by a first bonding wire, a bonding pad of the first semiconductor chip to a first bottom conductive foil that is on a second surface of the first substrate opposite the first surface of the first substrate, such that the first bonding wire is located in the window of the first substrate; forming a window through a center portion of a second substrate; attaching a first surface of the second substrate to a first surface of a second semiconductor chip; electrically connecting, by a second bonding wire, a bonding pad of the second semiconductor chip to a second bottom conductive foil that is on a second surface of the second substrate opposite the first surface of the second substrate, such that the second bonding wire is located in the window of the second substrate; attaching the second substrate to the first substrate and the first semiconductor chip; and electrically connecting, by a third bonding wire, a first top conductive foil on the first surface of the first substrate and a second top conductive foil on the first surface of the second substrate.

In some embodiment of the present disclosure, the manufacturing method of a semiconductor package further includes: forming a first portion of a molding compound on the first surface of the first substrate and a second portion of the molding compound in the window of the first substrate. The first portion of the molding compound covers the second substrate and the second semiconductor chip, and the second portion of the molding compound extends to the second surface of the first substrate.

In some embodiment of the present disclosure. The first substrate includes a conductive via in the first substrate and a conductive region on the second surface of the first substrate, and the manufacturing method of a semiconductor package further includes: soldering a solder ball to the conductive region such that the solder ball electrically connects to the conductive via.

In some embodiment of the present disclosure, the manufacturing method of a semiconductor package further includes: forming a window through a center portion of a third substrate; attaching a first surface of the third substrate to a first surface of a third semiconductor chip; electrically connecting, by a fourth bonding wire, a bonding pad of the third semiconductor chip to a third bottom conductive foil on a second surface of the third substrate opposite the first surface of the third substrate, such that the fourth bonding wire is located in the window of the third substrate; attaching the third substrate to the second substrate and the second semiconductor chip; electrically connecting the first substrate to the third substrate; forming a window through a center portion of a fourth substrate; attaching a first surface of the fourth substrate to a first surface of a fourth semiconductor chip; electrically connecting, by a fifth bonding wire, a bonding pad of the fourth semiconductor chip to a fourth bottom conductive foil on a second surface of the fourth substrate opposite the first surface of the fourth substrate, such that the fifth bonding wire is located in the window of the fourth substrate; attaching the fourth substrate to the third substrate and the third semiconductor chip; and electrically connecting the first substrate and the fourth substrate.

In some embodiment of the present disclosure, the manufacturing method of a semiconductor package further includes: electrically connecting, by a sixth bonding wire, a third top conductive foil located on the first surface of the third substrate to the first top conductive foil on the first surface of the first substrate.

In some embodiment of the present disclosure, the manufacturing method of a semiconductor package further includes: electrically connecting, by a seventh bonding wire, a fourth top conductive foil on the first surface of the fourth substrate to the first top conductive foil on the first surface of the first substrate.

In the aforementioned embodiments of the present disclosure, since the second bonding wire is in the window of the second substrate and electrically connect to the bonding pad of the second semiconductor chip and the second substrate, the first substrate can electrically connect to the second semiconductor chip by another bonding wire extending from the first substrate to the second substrate. As a result of such a design, the semiconductor package is capable of packaging more than one semiconductor chip in one package without the necessity of swapping the bonding pads and crossing the bonding wires, which avoids the possibility of short between the bonding wires. Moreover, the manufacturing method of the semiconductor package can effectively reduce a cycle time and cost of the manufacturing process for the semiconductor package without swapping bonding pads of a semiconductor chip on the first semiconductor chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
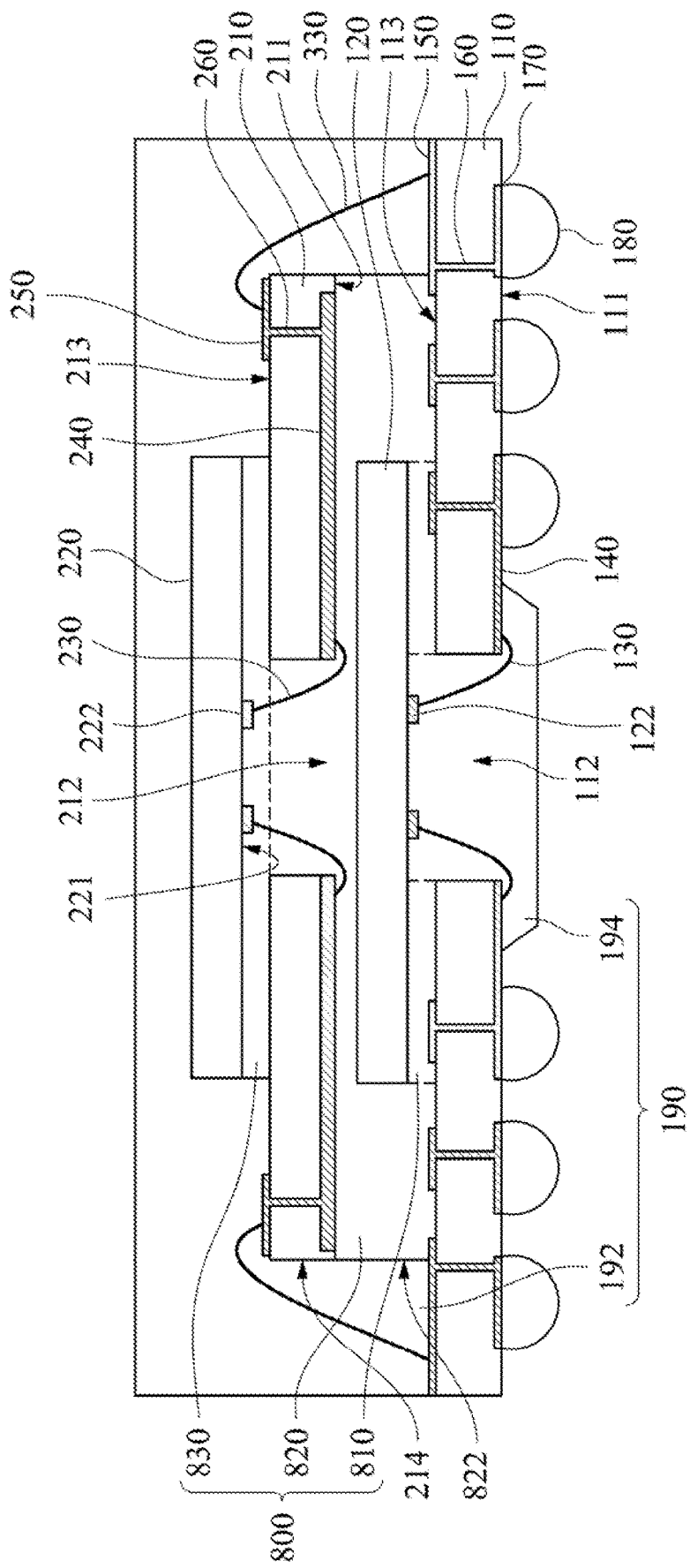
FIG. 1 is a cross-sectional view of a semiconductor package according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

FIG. 1 is a cross-sectional view of a semiconductor package 100 according to one embodiment of the present disclosure. Referring to FIG. 1, the semiconductor package 100 includes a first substrate 110, a first semiconductor chip 120, a first bonding wire 130, a second substrate 210, a second semiconductor chip 220 and a second bonding wire 230. The first substrate 110 and the second substrate 210 can be, for example, printed circuit boards (PCB), but not limited to it. The first substrate 110 has a window 112 through a center portion of the first substrate 110. The first semiconductor chip 120 is located on the first substrate 110, and the first semiconductor chip 120 has a bonding pad 122. The first bonding wire 130 is in the window 112 of the first substrate 110 and electrically connects to the bonding pad 122 of the first semiconductor chip 120 and the first substrate 110. The second substrate 210 is located on the first semiconductor chip 120, and has a window 212 through a center portion of the second substrate 210. The second substrate 210 electrically connects to the first substrate 110. The second semiconductor chip 220 is located on the second substrate 210, and the second semiconductor chip 220 has a bonding pad 222. The second bonding wire 230 is in the window 212 of the second substrate 210 and electrically connects to the bonding pad 222 of the second semiconductor chip 220 and the second substrate 210.

The semiconductor package 100 further includes a molding compound 190 having a first portion 192 and a second portion 194. The first portion 192 of the molding compound 190 is located on a top surface 113 of the first substrate 110 and covers the second substrate 210 and the second semiconductor chip 220, and the second portion 194 of the molding compound 190 is located in the window 112 of the first substrate 110 and extends to a bottom surface 111 of the first substrate 110. The semiconductor package 100 further includes a first bottom conductive foil 140 and a second bottom conductive foil 240. The first bottom conductive foil 140 is located on the bottom surface 111 of the first substrate 110. The first bottom conductive foil 140 electrically connects to the bonding pad 122 of the first semiconductor 120 by the first bonding wire 130. The second bottom conductive foil 240 is located on a bottom surface 211 of the second substrate 210. The second bottom conductive foil 240 electrically connects to the bonding pad 222 of the second semiconductor chip 220 by the second bonding wire 230.

The semiconductor package 100 further includes a first top conductive foil 150, a second top conductive foil 250 and a third bonding wire 330. The first top conductive foil 150 is located on the top surface 113 of the first substrate 110. The second top conductive foil 250 is located on a top surface 213 of the second substrate 210. The third bonding wire 330 electrically connects to the second top conductive foil 250 and the first top conductive foil 150.

The first substrate 110 further includes a conductive via 160, a conductive region 170 and a solder ball 180. The conductive via 160 is located in the first substrate 110 and through the top surface 113 of the first substrate 110 and the bottom surface 111 of the first substrate 110. The conductive via 160 electrically connects to the first bottom conductive foil 140 and the first top conductive foil 150. The conductive region 170 is located on the bottom surface 111 of the first substrate 110 and electrically connects to a bottom end of the conductive via 160. The solder ball 180 is located on the conductive region 170. The second substrate 210 further includes a conductive via 260. The conductive via 260 is located in the second substrate 210 and through the top surface 213 of the second substrate 210 and the bottom surface 211 of the second substrate 210. The conductive via 260 electrically connects to the second bottom conductive foil 240 and the second top conductive foil 250.

In some embodiments, the material of the first semiconductor chip 120 and the material of the second semiconductor chip 220 may include silicon, the material of the first bonding wire 130 and the material of the second bonding wire 230 may include gold, and the first top conductive foil 150, second top conductive foil 250, the conductive via 260, and the second bottom conductive foil 240 may be made of copper, but the present disclosure is not limited in this regard.

Since the second bonding wire 230 is in the window 212 of the second substrate 210 and electrically connect to the bonding pad 222 of the second semiconductor chip 220 and the second substrate 210, the first substrate 110 can electrically connect to the second semiconductor chip 220 by the third bonding wire 330 extending from the first substrate 110 to the second substrate 210. As a result of such a design, the semiconductor package 100 is capable of packaging more than one semiconductor chip in one package without the necessity of swapping the bonding pads and crossing the bonding wires, which avoids the possibility of short between the bonding wires.

In some embodiments, the semiconductor package 100 further includes an adhesive structure 800 located on the top surface 113 of the first substrate 110 and extends to a bottom surface 221 of the second semiconductor chip 220. The adhesive structure 800 includes a first adhesive layer 810, a second adhesive layer 820, and a third adhesive layer 830. The first adhesive layer 810 is located between the first substrate 110 and the first semiconductor chip 120. The second adhesive layer 820 is located between the first substrate 110 and the second substrate 210, between the first semiconductor chip 120 and the second substrate 210, and in the window 212 of the second substrate 210. The third adhesive layer 830 is located between the second substrate 210 and the second semiconductor chip 220. The second adhesive layer 820 of the adhesive structure 800 surrounds the first semiconductor chip 120 and has an edge 822 aligned with an edge 214 of the second substrate 210.

It is to be noted that the connection relationships, the materials, and the advantages of the elements described above will not be repeated in the following description. In the following description, a manufacturing method of the semiconductor package 100 in FIG. 1 is described.

Figure 2:
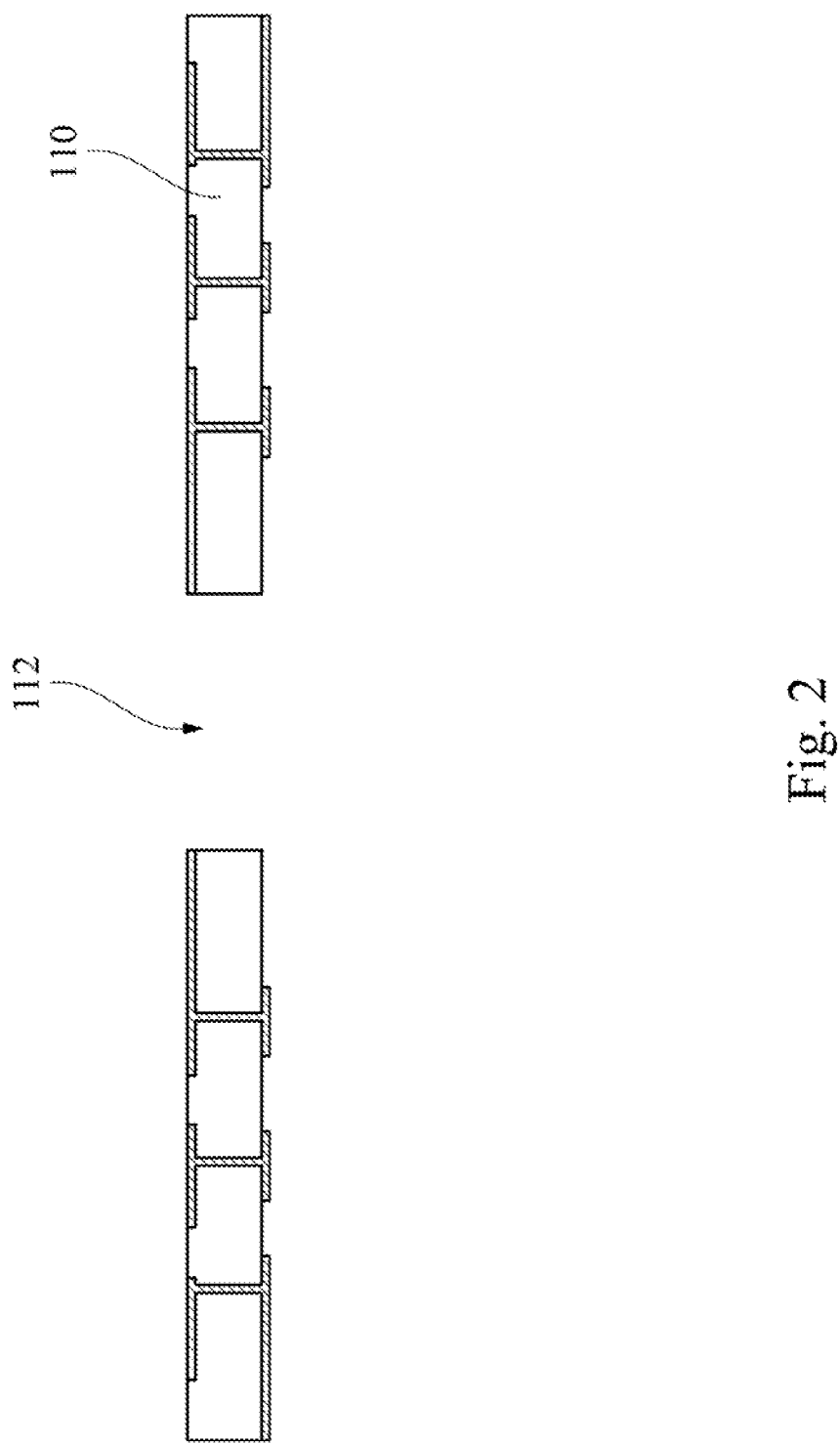
FIG. 2 is a cross-sectional view at an intermediate step of a manufacturing method of a semiconductor package according to one embodiment of the present disclosure.
Figure 3:
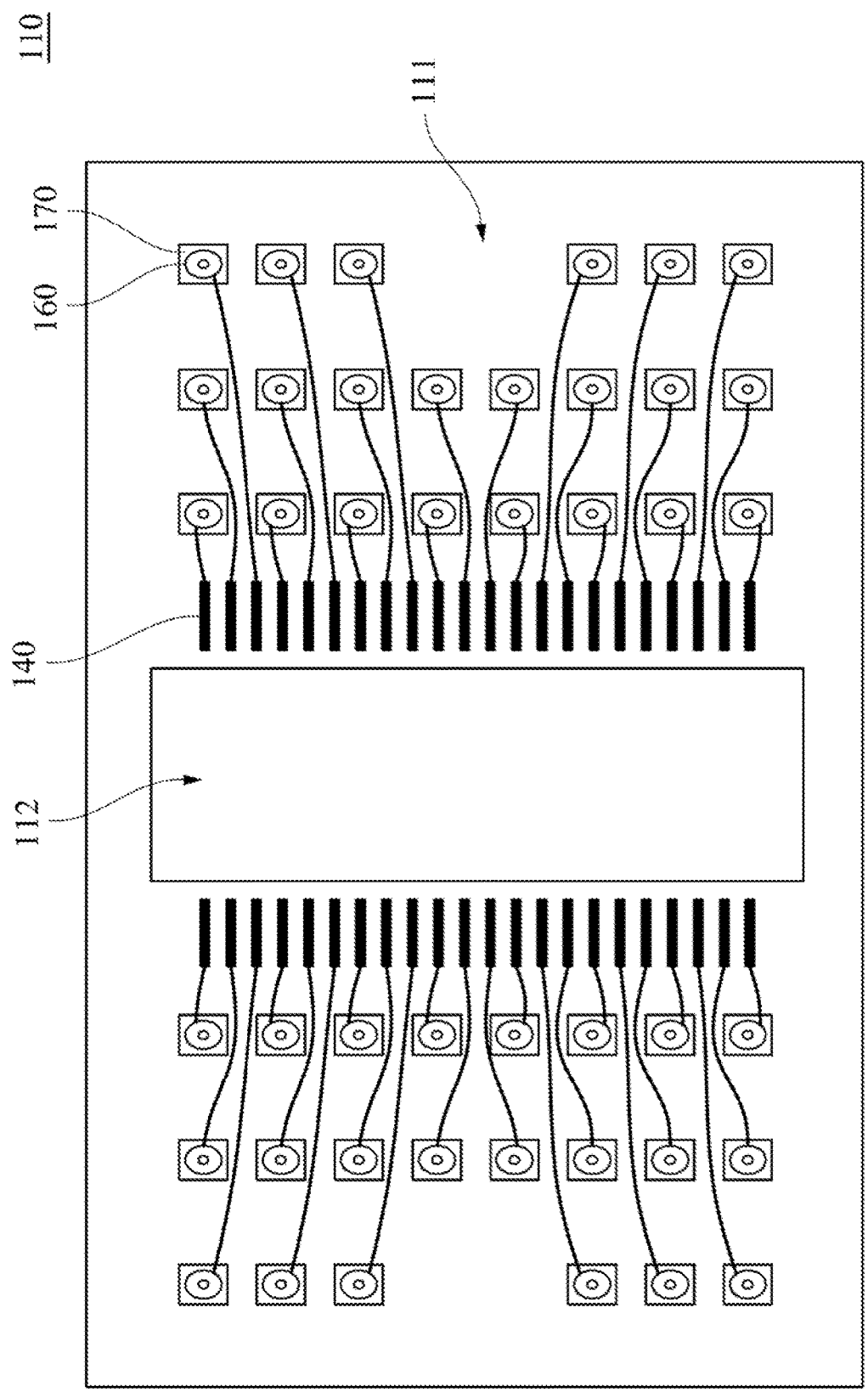
FIG. 3 is a bottom view of the first substrate of FIG. 2.
Figure 4:
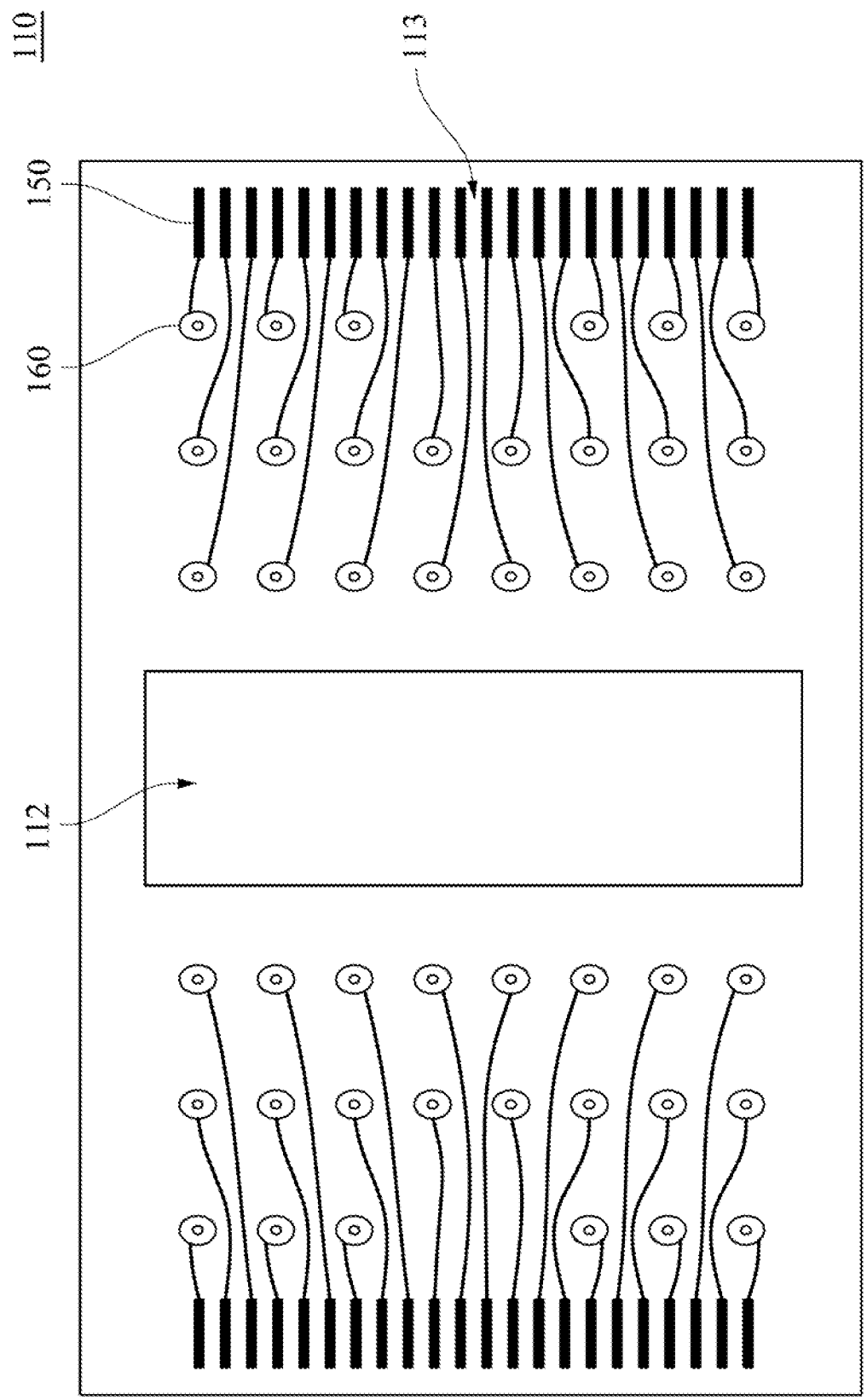
FIG. 4 is a top view of the first substrate of FIG. 2.

FIG. 2 is a cross-sectional view at an intermediate step of a manufacturing method of the semiconductor package 100 according to one embodiment of the present disclosure. FIG. 3 is a bottom view of the first substrate 110 of FIG. 2. FIG. 4 is a top view of the first substrate 110 of FIG. 2. Referring to FIG. 2 to FIG. 4, the manufacturing method of the semiconductor package 100 includes forming the window 112 through the center portion of the first substrate 110. The first bottom conductive foil 140, the conductive region 170 and the bottom end of the conductive via 160 are located on the bottom surface 111 of the first substrate 110. The first bottom conductive foil 140 electrically connects to the conductive via 160. As shown in FIG. 3, the electrical connection between the first bottom conductive foil 140 and the conductive via 160 may be by a conductive line, but the first bottom conductive foil 140 can also directly connect the conductive via 160 by extending the length of the first bottom conductive foil 140. The first top conductive foil 150 and the top end of the conductive via 160 are located on the top surface 113 of the first substrate 110. The first top conductive foil 150 electrically connects to the conductive via 160. As shown in FIG. 4, the electrical connection between the first top conductive foil 150 and the conductive via 160 may be by a conductive line, but the first top conductive foil 150 can also directly connect the conductive via 160 by extending the length of the first top conductive foil 150. The number of the first bottom conductive foils 140, the number of the first top conductive foils 150 and the number of the conductive vias 160 are not limited to the amount shown in the drawings. In some embodiments, the first bottom conductive foils 140, the conductive vias 160 and the first top conductive foils 150 are one-to-one connection.

Figure 5:
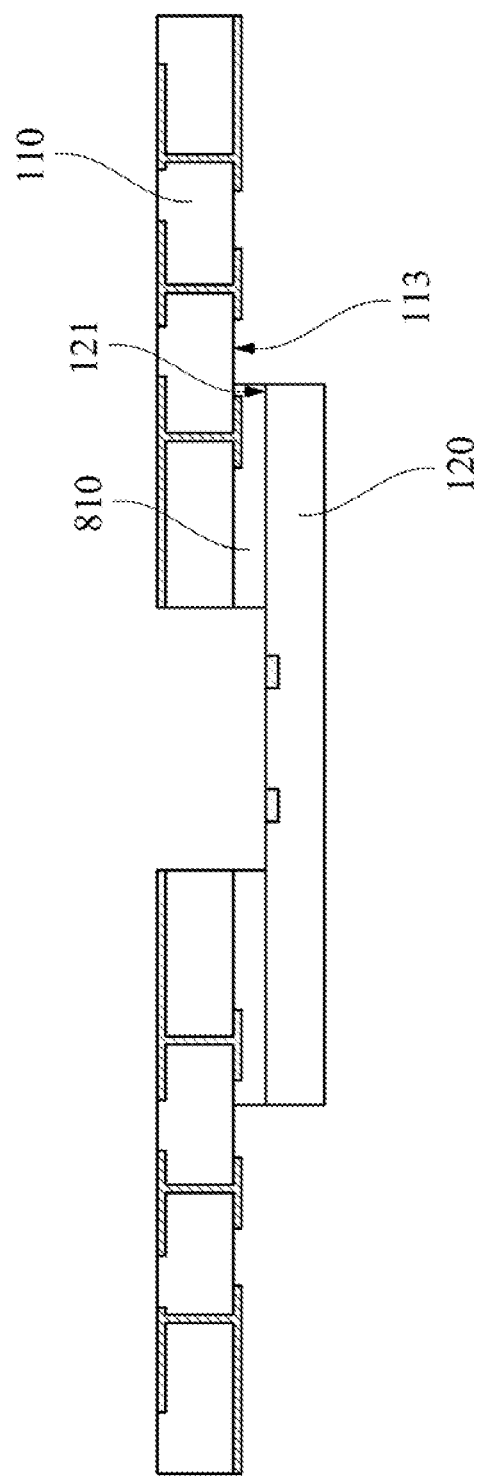
FIG. 5 to FIG. 7 are cross-sectional views at intermediate steps of the manufacturing method of the semiconductor package after the step of FIG. 2.
Figure 6:
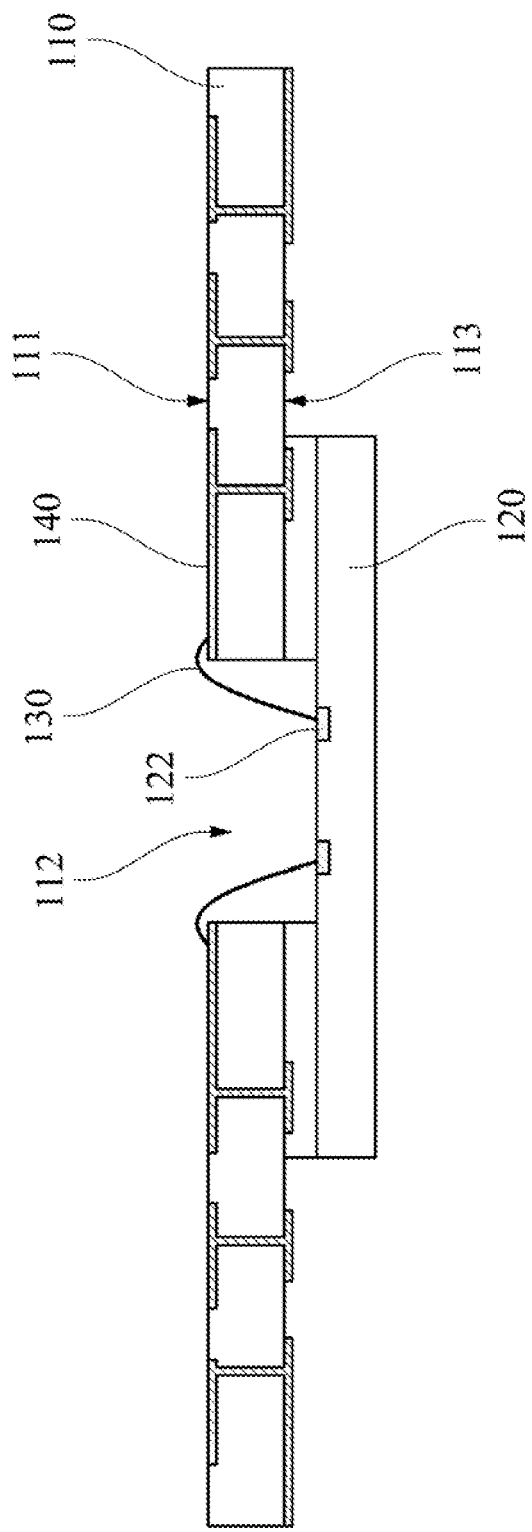
Figure 7:
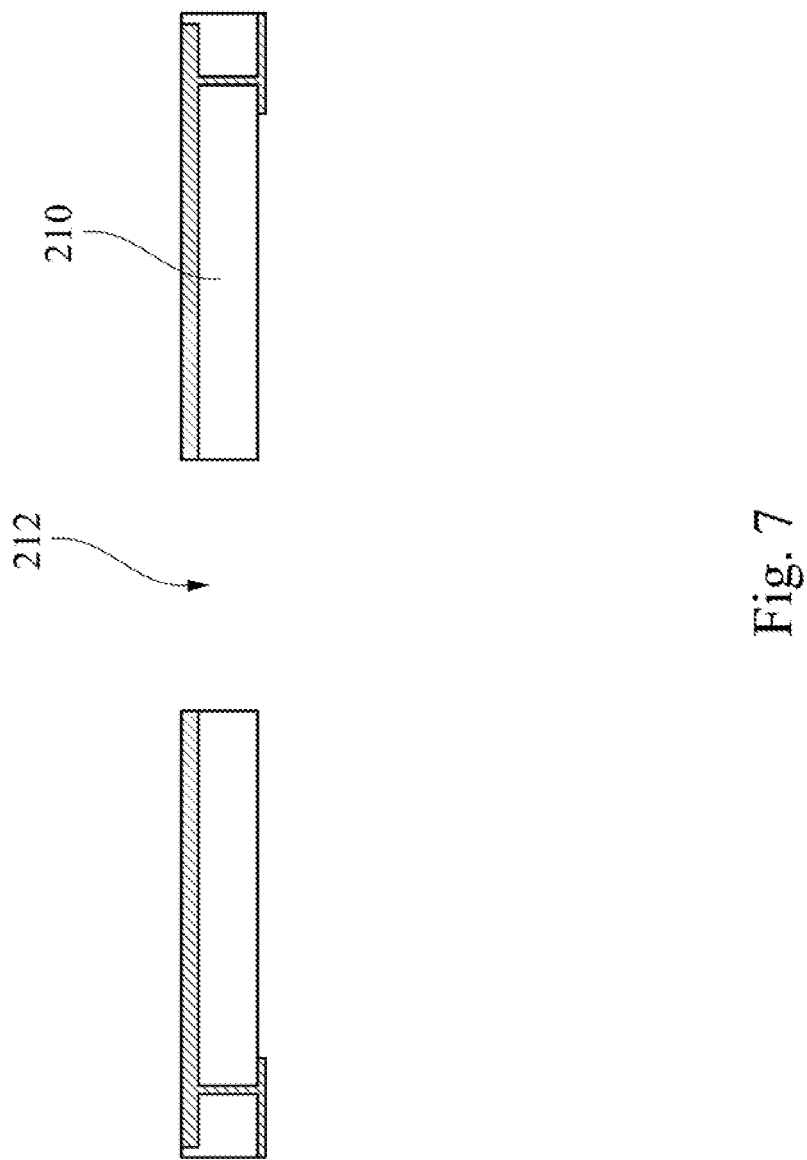

FIG. 5 to FIG. 7 are cross-sectional views at intermediate steps of the manufacturing method of the semiconductor package 100 after the step of FIG. 2. Referring to FIG. 5 and FIG. 6, thereafter, a first surface (i.e., the top surface 113) of the first substrate 110 is attached to a first surface (i.e., a bottom surface 121) of the first semiconductor chip 120. Afterwards, the bonding pad 122 of the first semiconductor chip 120 electrically connects, by the first bonding wire 130, to the first bottom conductive foil 140 that is on a second surface (i.e., the bottom surface 111) of the first substrate 110 opposite the first surface 113 of the first substrate 110, such that the first bonding wire 130 is located in the window 112 of the first substrate 110. The step of attaching the first substrate 110 to the first semiconductor chip 120 is performed through attaching the first adhesive layer 810 in between. In some embodiments, the adhesive layer 810 can be, for example, a layer of die attach film (DAF), and can be dried through a baking process to adhere the first substrate 110 and the first semiconductor chip 120, but the present disclosure is not limited in this regard.

Figure 8:
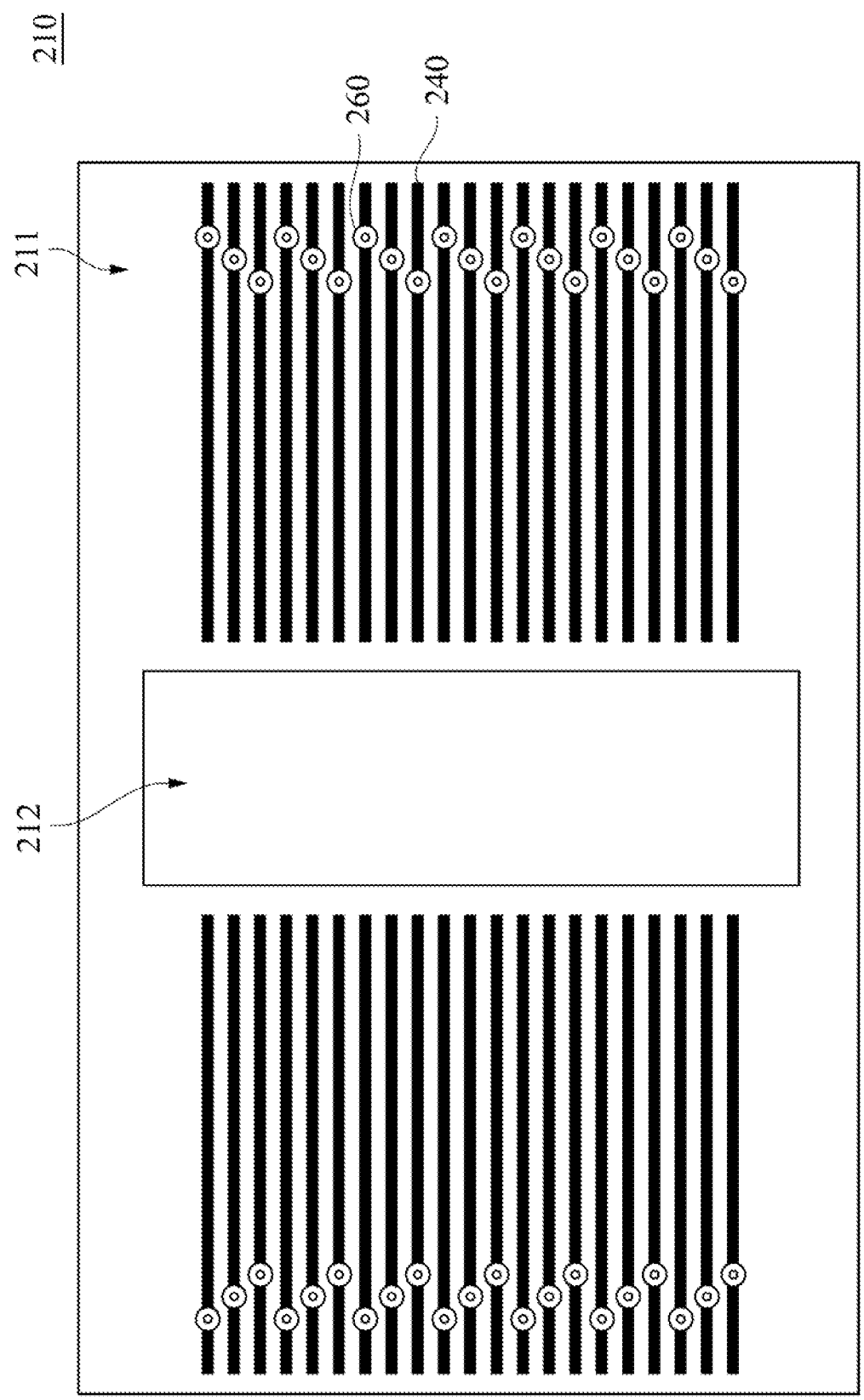
FIG. 8 is a bottom view of the second substrate of FIG. 7.
Figure 9:
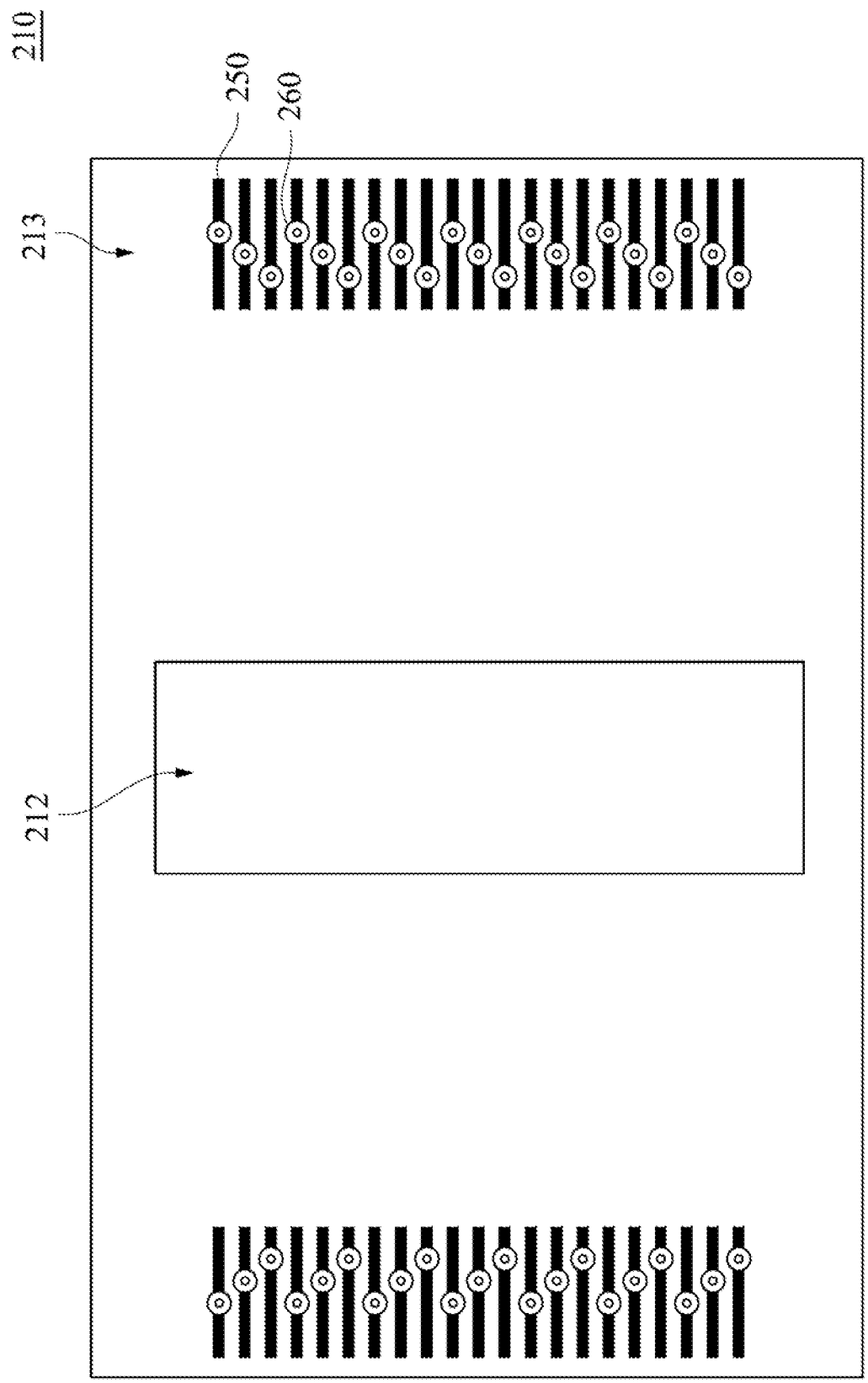
FIG. 9 is a top view of the second substrate of FIG. 7.

FIG. 8 is a bottom view of the second substrate 210 of FIG. 7. FIG. 9 is a top view of the second substrate 210 of FIG. 7. Referring to FIG. 7 to FIG. 9, the window 212 is formed through the center portion of the second substrate 210. The second bottom conductive foil 240 and the bottom end of the conductive via 260 are located on the bottom surface 211 of the second substrate 210. The second bottom conductive foil 240 electrically connects to the conductive via 260. As shown in FIG. 8, the electrical connection between the second bottom conductive foil 240 and the conductive via 260 may be directly connected, but the second bottom conductive foil 240 may also connect to the conductive via 260 by a conductive line. The second top conductive foil 250 and the top end of the conductive via 260 are located on the top surface 213 of the second substrate 210. The second top conductive foil 250 electrically connects to the conductive via 260. As shown in FIG.

9, the electrical connection between the first top conductive foil 250 and the conductive via 260 may be directly connected, but the second top conductive foil 250 may also connect to the conductive via 260 by a conductive line. The number of the second bottom conductive foils 240, the number of the second top conductive foils 250 and the number of the conductive vias 260 are not limited to the amount shown in the drawings, but the second bottom conductive foils 240, the conductive vias 260 and the second top conductive foils 250 are one-to-one connection.

Figure 10:
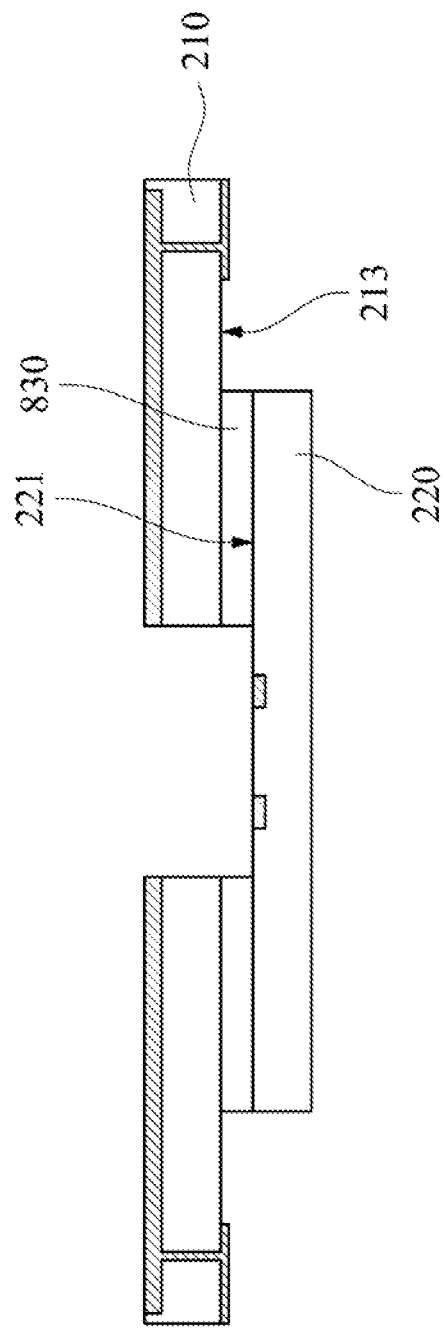
FIG. 10 to FIG. 14 are cross-sectional views at intermediate steps of the manufacturing method of the semiconductor package after the step of FIG. 7.
Figure 11:
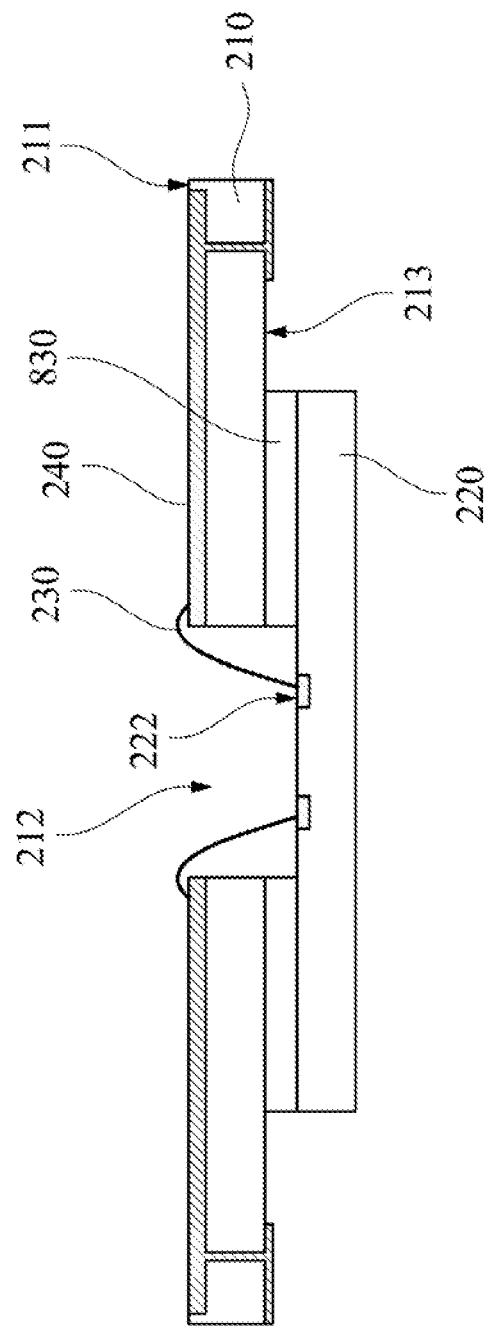

FIG. 10 to FIG. 14 are cross-sectional views at intermediate steps of the manufacturing method of the semiconductor package 100 after the step of FIG. 7. Referring to FIG. 10 and FIG. 11, after the step in FIG. 7, a first surface (i.e., the top surface 213) of the second substrate 210 is attached to a first surface (i.e., the bottom surface 221) of the second semiconductor chip 220. Next, the bonding pad 222 of the second semiconductor chip 210 electrically connects, by the second bonding wire 230, to the second bottom conductive foil 240 that is on a second surface (i.e., the bottom surface 211) of the second substrate 210 opposite the first surface 213 of the second substrate 210, such that the second bonding wire 230 is located in the window 212 of the second substrate 210. The step of attaching the second substrate 210 and the second semiconductor chip 220 is performed through attaching the third adhesive layer 830 in between. In some embodiments, the adhesive layer 830 may be, for example, a layer of die attach film (DAF), and may be dried through a baking process to adhere the second substrate 210 and the second semiconductor chip 220, but the present disclosure is not limited in this regard.

Figure 12:
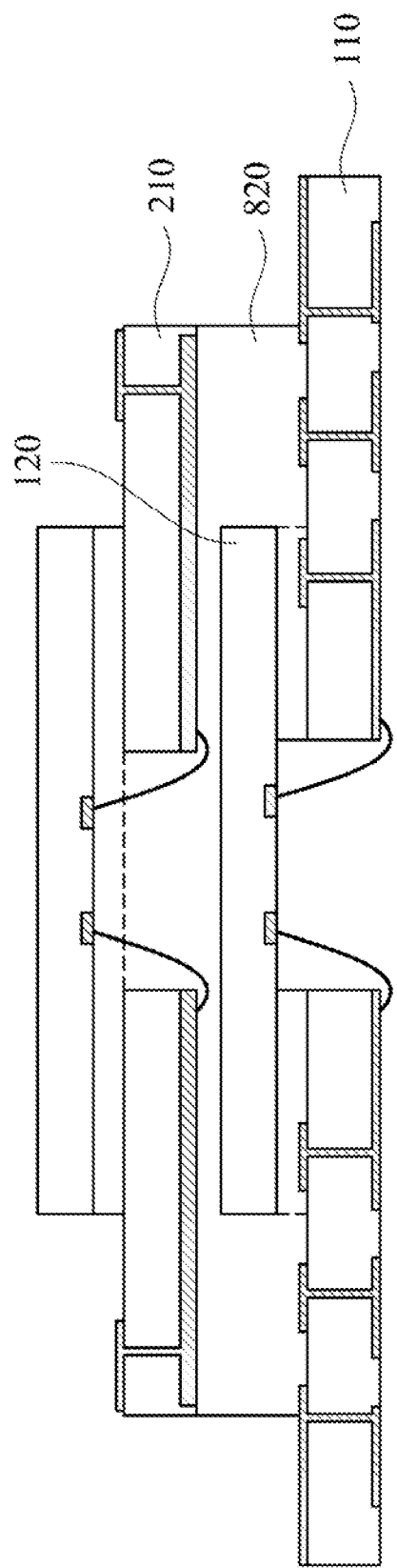

Referring to FIG. 12, thereafter, the second substrate 210 is attached to the first substrate 110 and the first semiconductor chip 120. The step of attaching the second substrate 210, the first semiconductor chip 120 and the first substrate 110 is performed by attaching the second adhesive layer 820 in between.

Figure 13:
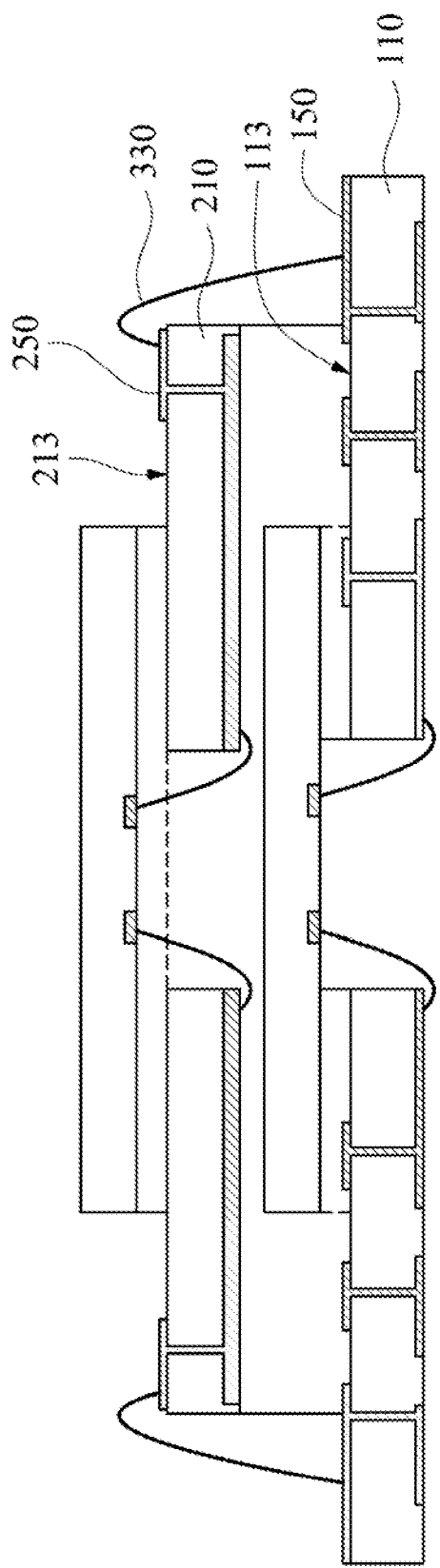

Referring to FIG. 13, thereafter, the first top conductive foil 150 on the first surface 113 of the first substrate 110 electrically connects, by the third bonding wire 330, to the second top conductive foil 250 on the first surface 213 of the second substrate 210.

Figure 14:
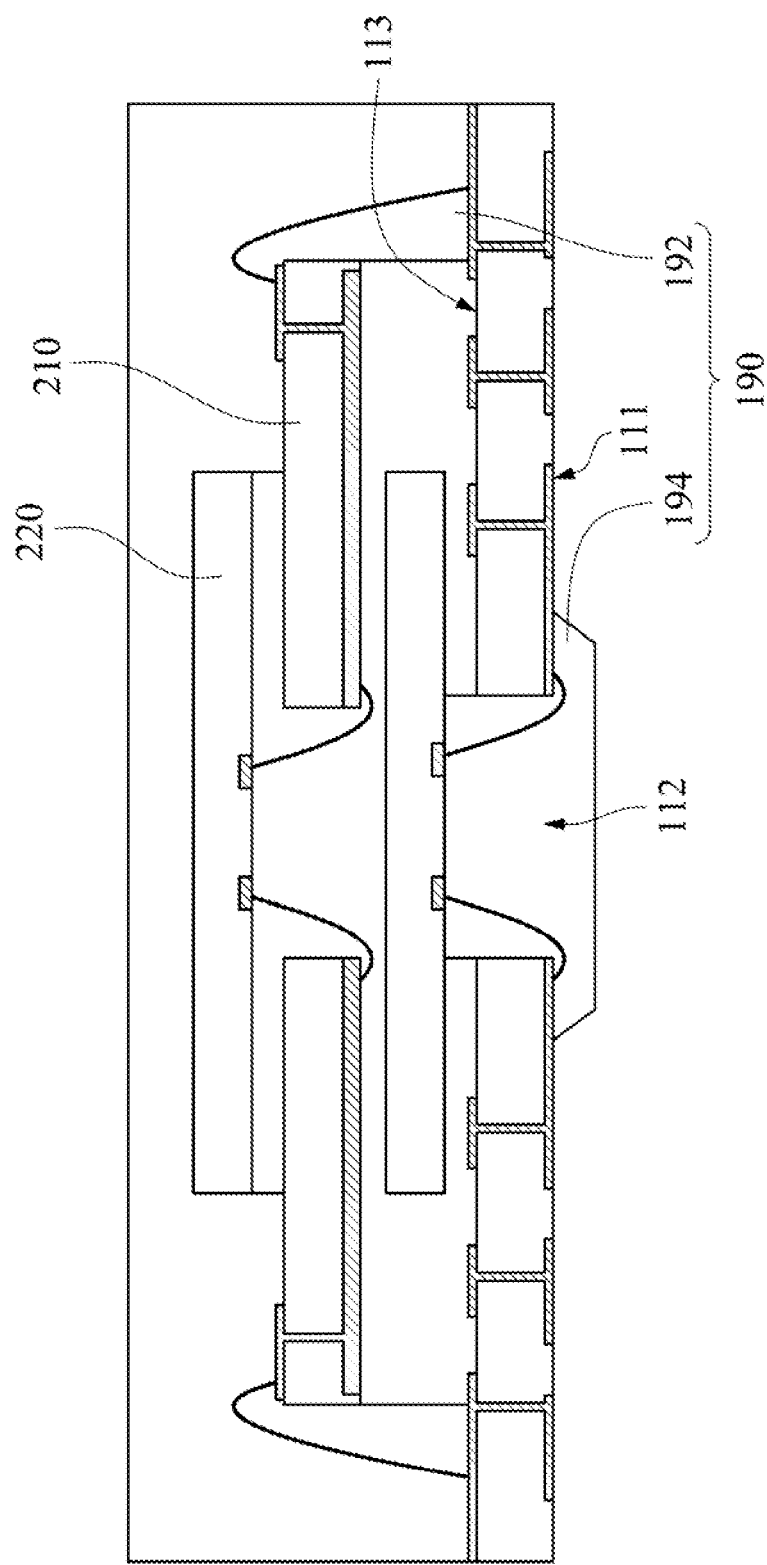

Referring to FIG. 14 and FIG. 1, thereafter, the first portion 192 of the molding compound 190 on the first surface 113 of the first substrate 110 and the second portion 194 of the molding compound 190 in the window 112 of the first substrate 110 are formed. The first portion 192 of the molding compound 190 covers the second substrate 210 and the second semiconductor chip 220, and the second portion 194 of the molding compound 190 extends to the second surface 111 of the first substrate 110. In some embodiments, the first portion 192 and the second portion 194 of the molding compound 190 are formed at the same time. The shape of the molding compound 190 is determined by the shape of a mold. In other words, the first portion 192 and the second portion 194 of the molding compound 190 are simultaneously formed in one molding step. Subsequently, the solder ball 180 is soldered to the conductive region 170 such that the solder ball 180 electrically connects to the conductive via 160. The method used in the soldering of the solder ball 180 can include solder reflowing, but not limited to it. After the last step, the semiconductor package 100 of FIG. 1 is formed.

The manufacturing method of the semiconductor package 100 can effectively reduce a cycle time and cost of the manufacturing process for the semiconductor package without swapping bonding pads of a semiconductor chip on the first semiconductor chip.

Figure 15:
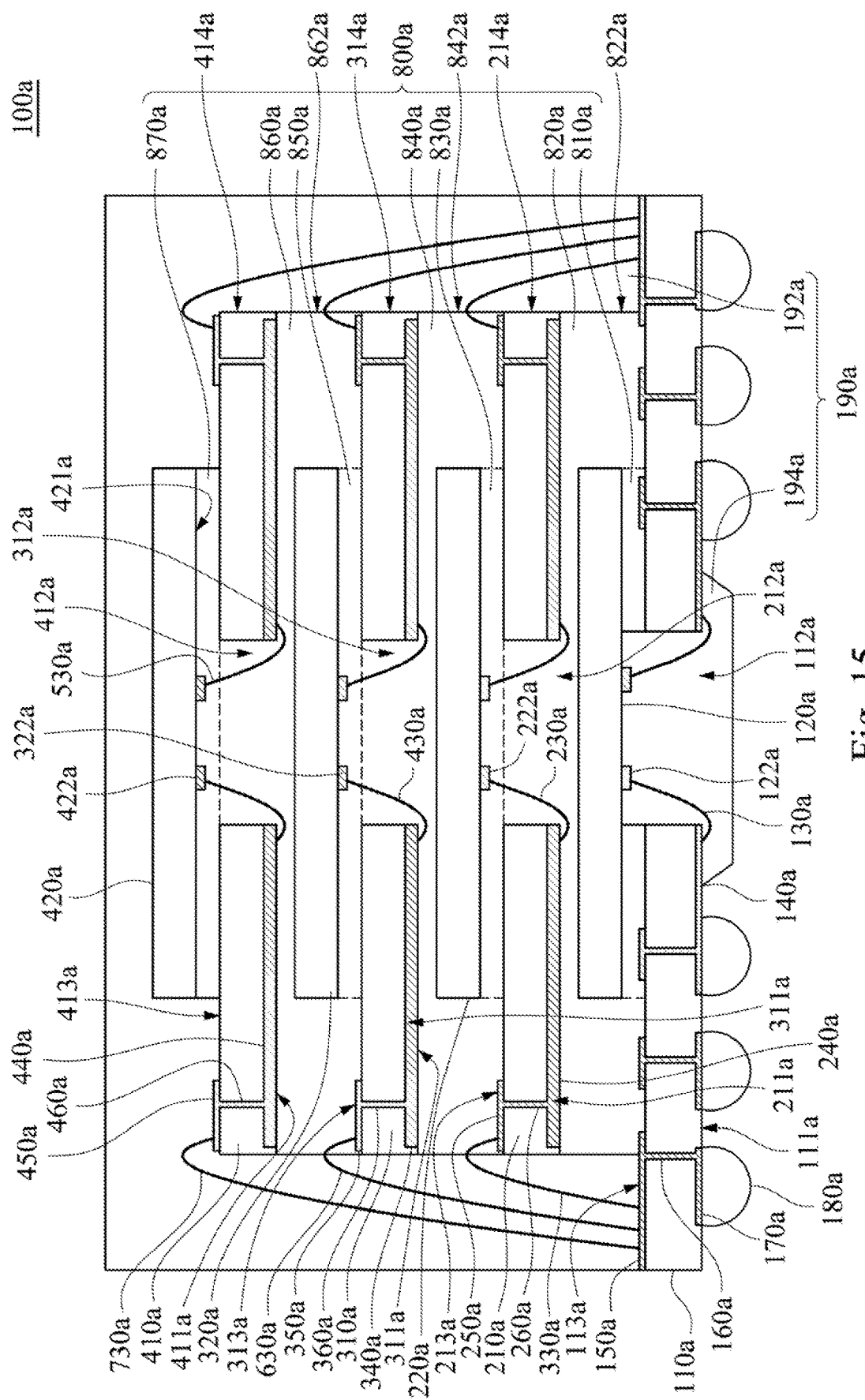
FIG. 15 is a cross-sectional view of a semiconductor package according to another embodiment of the present disclosure.

FIG. 15 is a cross-sectional view of a semiconductor package 100a according to another embodiment of the present disclosure. Referring to FIG. 15, the semiconductor package 100a includes a first substrate 110a, a first semiconductor chip 120a, a first bonding wire 130a, a second substrate 210a, a second semiconductor chip 220a, a second bonding wire 230a, a third bonding wire 330a, a third substrate 310a, a third semiconductor chip 320a, a fourth bonding wire 430a, a fourth substrate 410a, a fourth semiconductor chip 420a and a fifth bonding wire 530a. The first substrate 110a, the first semiconductor chip 120a, the first bonding wire 130a, the second substrate 210a, the second semiconductor chip 220a, the second bonding wire 230a and the third bonding wire 330a has the same structure as shown in FIG. 13, so the description will not be repeated.

The third substrate 310a is located on the second semiconductor chip 220a, and has a window 312a through a center portion of the third substrate 310a. The third substrate 310a electrically connects to the first substrate 110a. The third semiconductor chip 320a is located on the third substrate 310a. The third semiconductor chip 320a has a bonding pad 322a. The fourth bonding wire 430a is in the window 312a of the third substrate 310a and electrically connects to the bonding pad 322a of the third semiconductor chip 320a and the third substrate 310a. The fourth substrate 410a is located on the third semiconductor chip 320a, and has a window 412a through a center portion of the fourth substrate 410a. The fourth substrate 410a electrically connects to the first substrate 110a. The fourth semiconductor chip 420a is located on the fourth substrate 410a. The fourth semiconductor chip 420a has a bonding pad 422a. The fifth bonding wire 530a is in the window 412a of the fourth substrate 410a and electrically connects to the bonding pad 422a of the fourth semiconductor chip 420a and the fourth substrate 410a.

The semiconductor package 100a further includes a third bottom conductive foil 340a and a fourth bottom conductive foil 440a. The third bottom conductive foil 340a is located on a bottom surface 311a of the third substrate 310a. The third bottom conductive foil 340a electrically connects to the bonding pad 322a of the third semiconductor chip 320a by the fourth bonding wire 430a. The fourth bottom conductive foil 440a is located on a bottom surface 411a of the fourth substrate 410a. The fourth bottom conductive foil 440a electrically connects to the bonding pad 422a of the fourth semiconductor chip 420a by the fifth bonding wire 530a.

The semiconductor package 100a further includes a third top conductive foil 350a and a conductive via 360a. The third top conductive foil 350a is located on a top surface 313a of the third substrate 310a. The third top conductive foil 350a electrically connects to the first substrate 110a by a sixth bonding wire 630a. The conductive via 360a is located in the third substrate 310a and through the top surface 313a of the third substrate 310a and the bottom surface 311a of the third substrate 310a. The conductive via 360a electrically connects to the third bottom conductive foil 340a and the third top conductive foil 350a. The conductive via 360a, the third bottom conductive foil 340a, the third top conductive foil 350a and the third substrate 310a has a similar configuration as the conductive via 260a, the second bottom conductive foil 240a, the second top conductive foil 250a and the second substrate 210a.

The semiconductor package 100a further includes a fourth top conductive foil 450a and a conductive via 460a. The fourth top conductive foil 450a is located on a top surface 413a of the fourth substrate 410a. The fourth top conductive foil 450a electrically connects to the first substrate 110a by a seventh bonding wire 730a. The conductive via 460a is located in the fourth substrate 410a and through the top surface 413a of the fourth substrate 410a and the bottom surface 411a of the fourth substrate 410a. The conductive via 460a electrically connects to the fourth bottom conductive foil 440a and the fourth top conductive foil 450a. The conductive via 460a, the fourth bottom conductive foil 440a, the fourth top conductive foil 450a and the fourth substrate 410a has a similar configuration as the conductive via 260a, the second bottom conductive foil 240a, the second top conductive foil 250a and the second substrate 210a.

The semiconductor package 100a further includes an adhesive structure 800a located on a top surface 113a of the first substrate 110a and extends to a bottom surface 421a of the fourth semiconductor chip 420a. The adhesive structure 800a includes a first adhesive layer 810a located between the first substrate 110a and the first semiconductor chip 120a, a second adhesive layer 820a between the first substrate 110a and the second substrate 210a, between the first semiconductor chip 120a and the second substrate 220a, and in the window 212a of the second substrate 210a, a third adhesive layer 830a between the second substrate 210a and the second semiconductor chip 220a, a fourth adhesive layer 840a between the second substrate 210a and the third substrate 310a, between the second semiconductor chip 220a and the third substrate 310a, and in the window 312a of the third substrate 310a, a fifth adhesive layer 850a between the third substrate 310a and the third semiconductor chip 320a, a sixth adhesive layer 860a between the third substrate 310a and the fourth substrate 410a, between the third semiconductor chip 320a and the fourth substrate 410a, and in the window 412a of the fourth substrate 410a, and a seventh adhesive layer 870a between the fourth substrate 410a and the fourth semiconductor chip 420a.

The second adhesive layer 820a of the adhesive structure 800a surrounds the first semiconductor chip 120a and has an edge 822a aligned with an edge 214a of the second substrate 210a. The fourth adhesive layer 840a of the adhesive structure 800a surrounds the second semiconductor chip 220a and has an edge 842a aligned with an edge 314a of the third substrate 310a. The sixth adhesive layer 860a of the adhesive structure 800a surrounds the third semiconductor chip 320a and has an edge 862a aligned with an edge 414a of the fourth substrate 410a.

Figure 16:
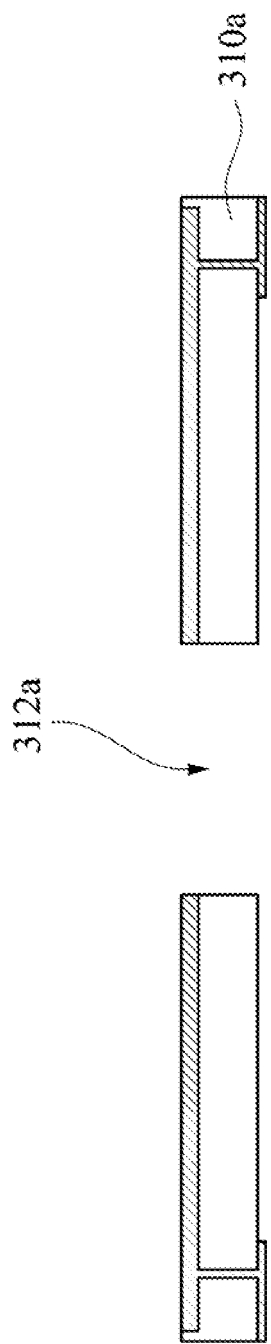
FIG. 16 to FIG. 26 are cross-sectional views at intermediate steps of the manufacturing method of the semiconductor package of FIG. 15 after the step of FIG. 13.
Figure 17:
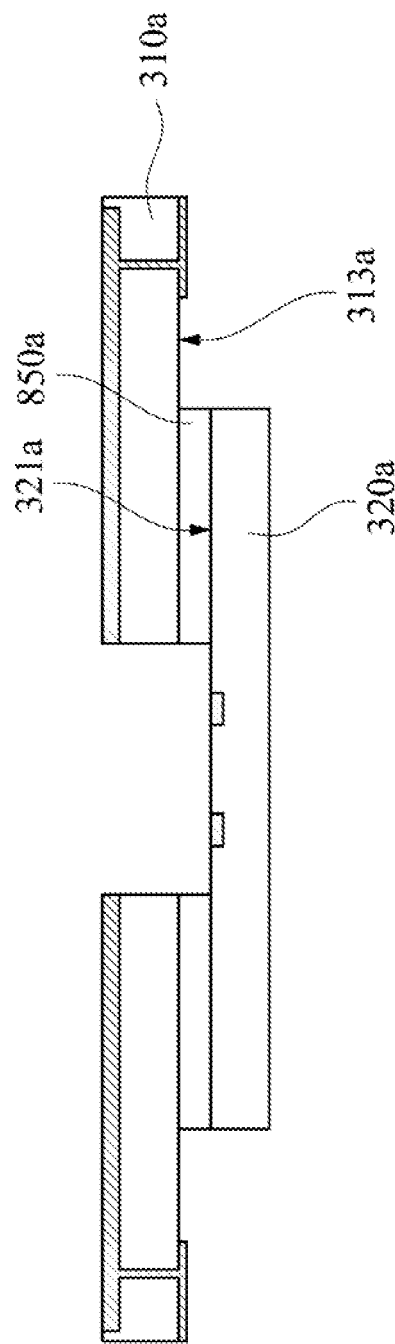
Figure 18:
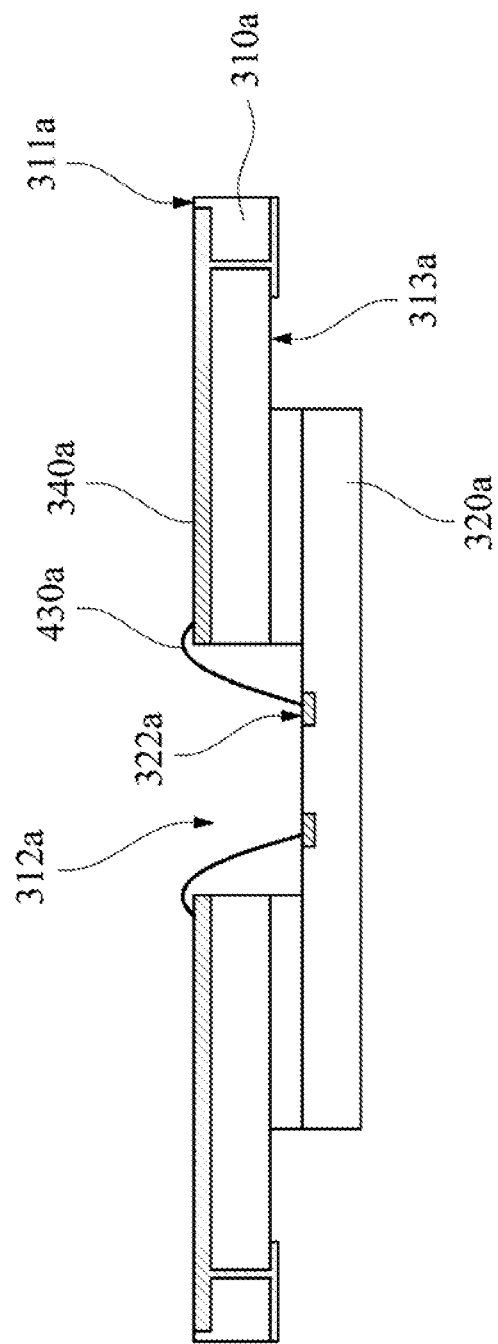

FIG. 16 to FIG. 26 are cross-sectional views at intermediate steps of the manufacturing method of the semiconductor package 100a of FIG. 15 after the step of FIG. 13. Referring to FIG. 16 to FIG. 18, the manufacturing method of the semiconductor package includes forming the window 312a through the center portion of the third substrate 310a; attaching a first surface (i.e., the top surface 313a) of the third substrate 310a to a first surface (i.e. a bottom surface 321a) of the third semiconductor chip 320a. Next, the bonding pad 322a of the third semiconductor chip 320a electrically connects, by the fourth bonding wire 430a, to the third bottom conductive foil 340a on a second surface (i.e., the bottom surface 311a) of the third substrate 310a opposite the first surface 313a of the third substrate 310a, such that the fourth bonding wire 430a is located in the window 312a of the third substrate 310a. The step of attaching the third substrate 310a and the third semiconductor chip 320a is performed by attaching the fifth adhesive layer 850a in between.

Figure 19:
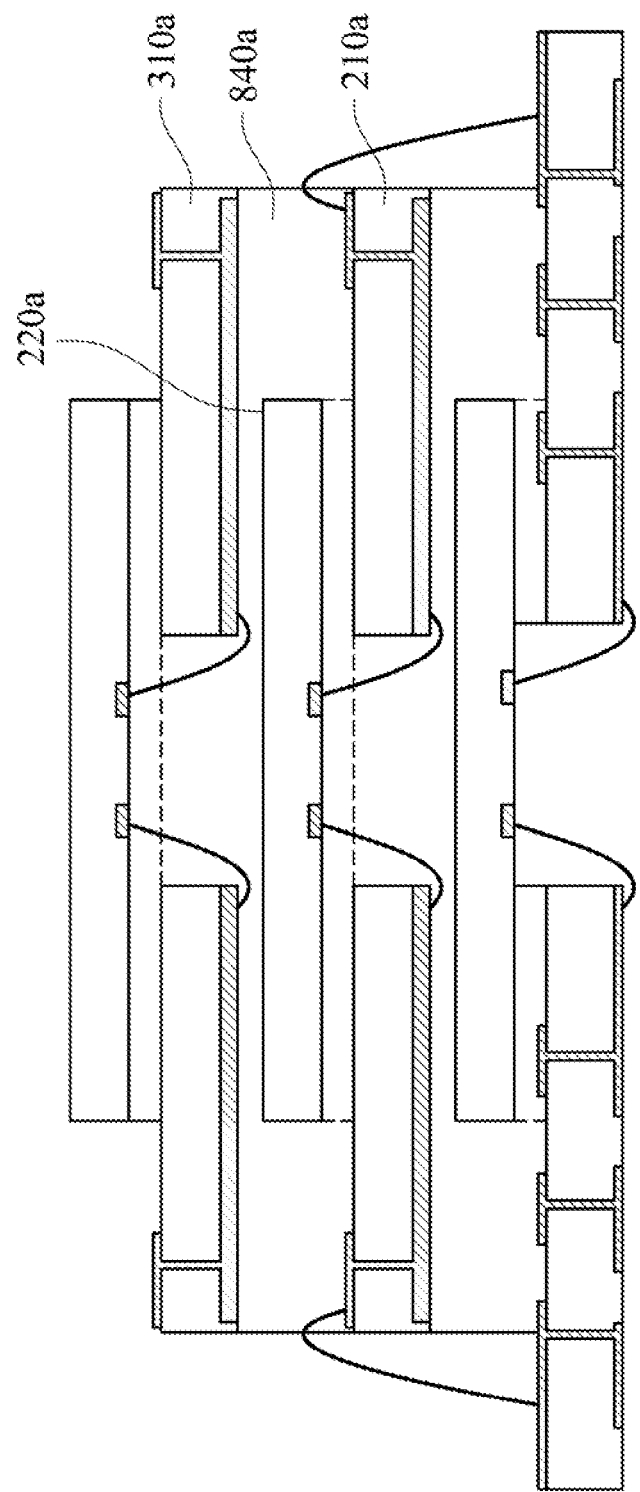
Figure 20:
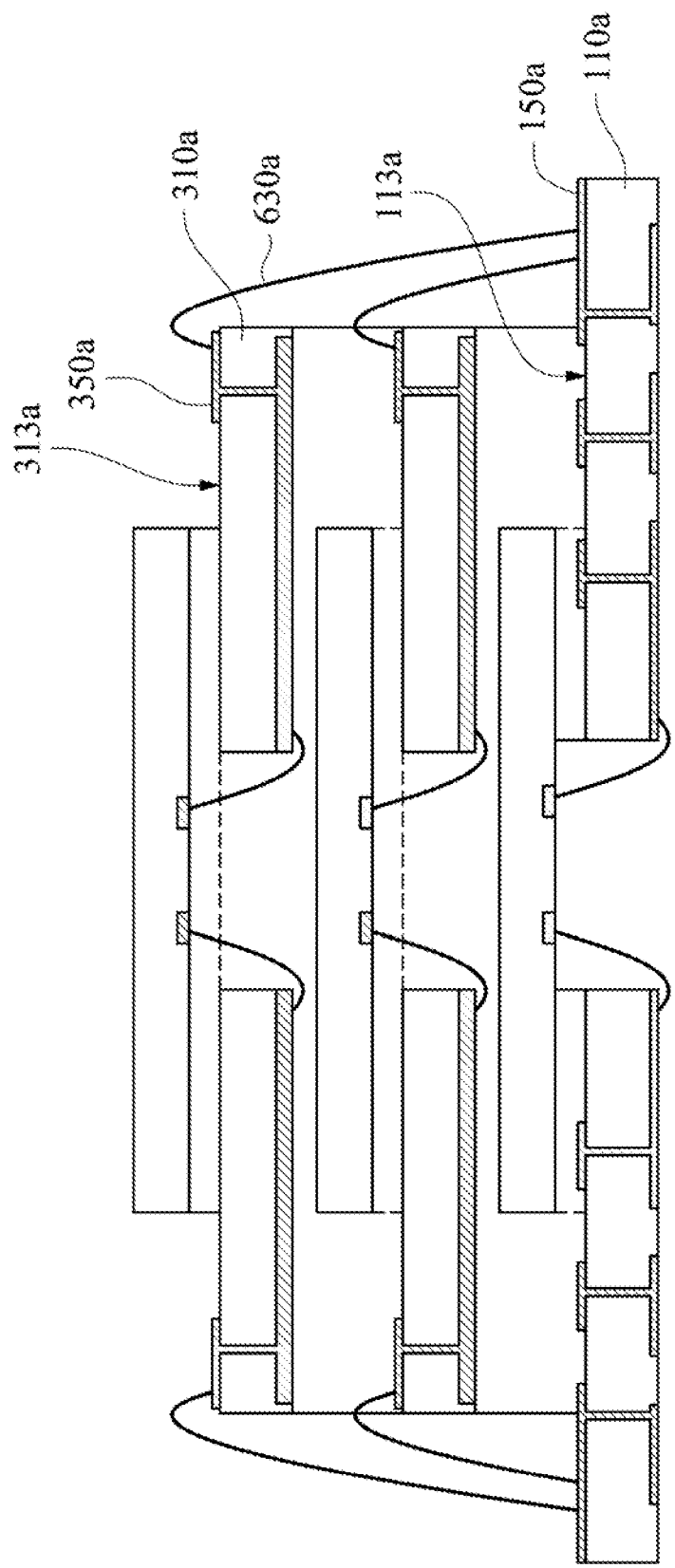

Referring to FIG. 19 and FIG. 20, thereafter, the third substrate is attached to the second substrate 210a and the second semiconductor chip 210a on top of the structure of FIG. 13. The step is performed by attaching the fourth adhesive layer 840a in between. Thereafter, the first top conductive foil 150a located on the first surface 113a of the first substrate 110a electrically connects, by the sixth bonding wire 630a, to the third top conductive foil 350a located on the first surface 313a of the third substrate 310a.

Figure 21:
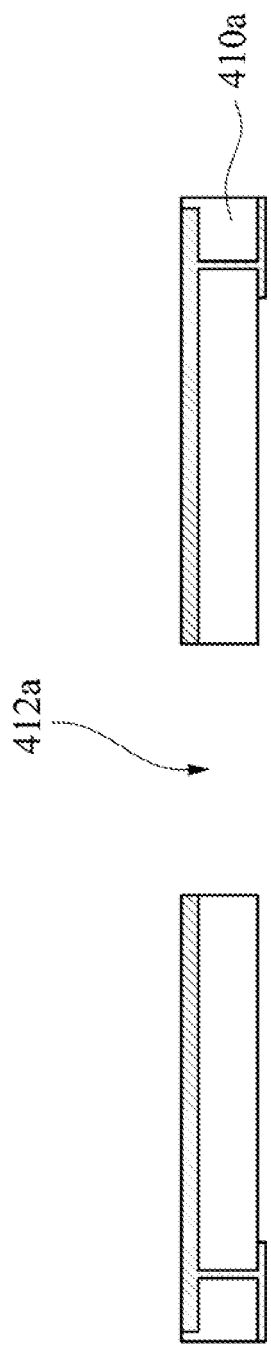
Figure 22:
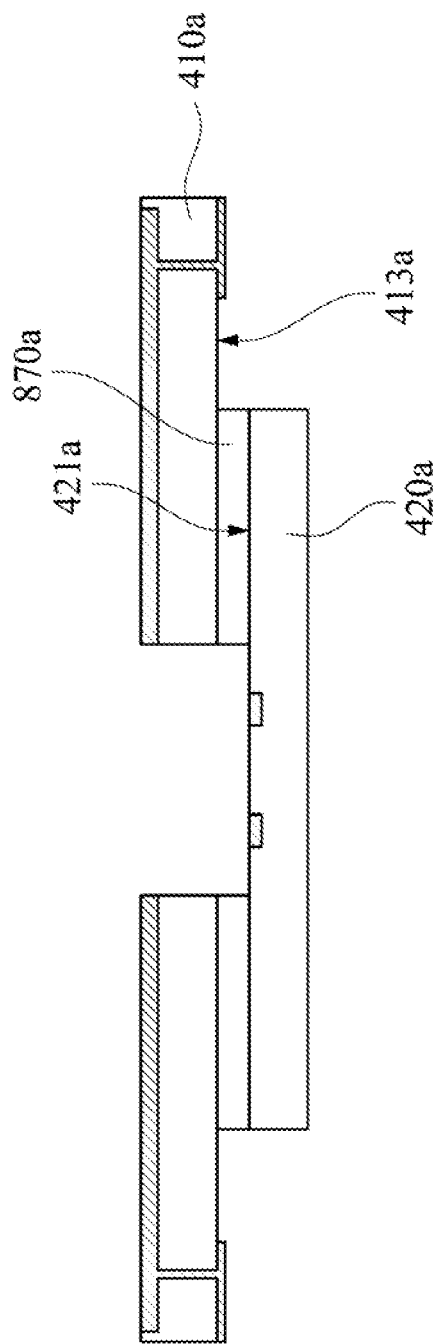
Figure 23:
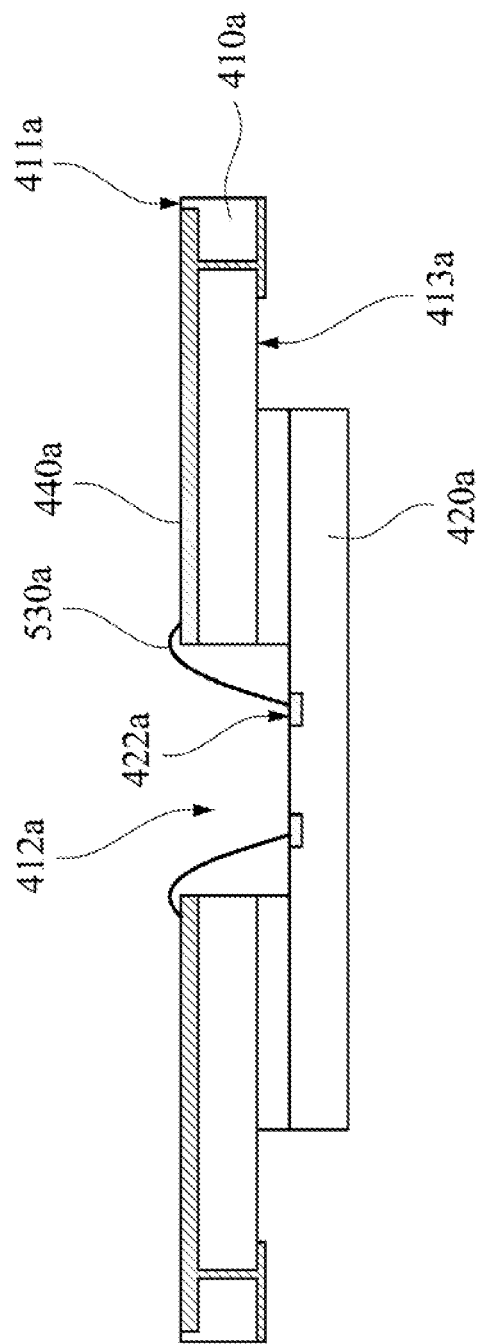

Referring to FIGS. 21 to 23, the window 412a is formed through the center portion of the fourth substrate 410a. Thereafter, a first surface (i.e., the top surface 413a) of the fourth substrate 410a is attached to a first surface (i.e., the bottom surface 421a) of the fourth semiconductor chip 420a. Thereafter, the bonding pad 422a of the fourth semiconductor chip 420a electrically connects, by the fifth bonding wire 530a, to the fourth bottom conductive foil 440a on a second surface (i.e., the bottom surface 411a) of the fourth substrate 410a opposite the first surface 413a of the fourth substrate 410a, such that the fifth bonding wire 530a is located in the window 412a of the fourth substrate 410a. The step of attaching the fourth substrate 410a and the fourth semiconductor chip 420a is performed by attaching the seventh adhesive layer 870a in between.

Figure 24:
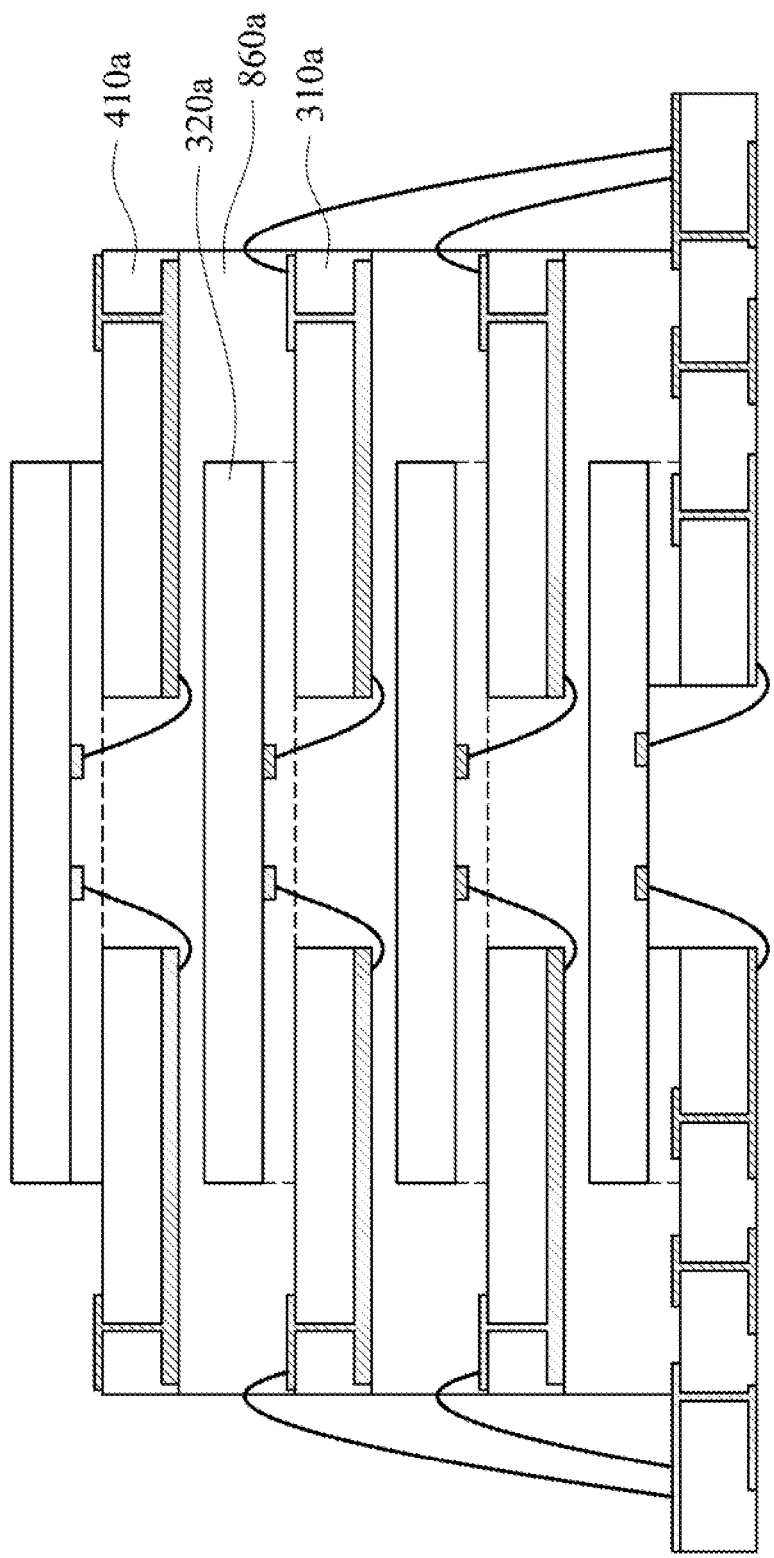
Figure 25:
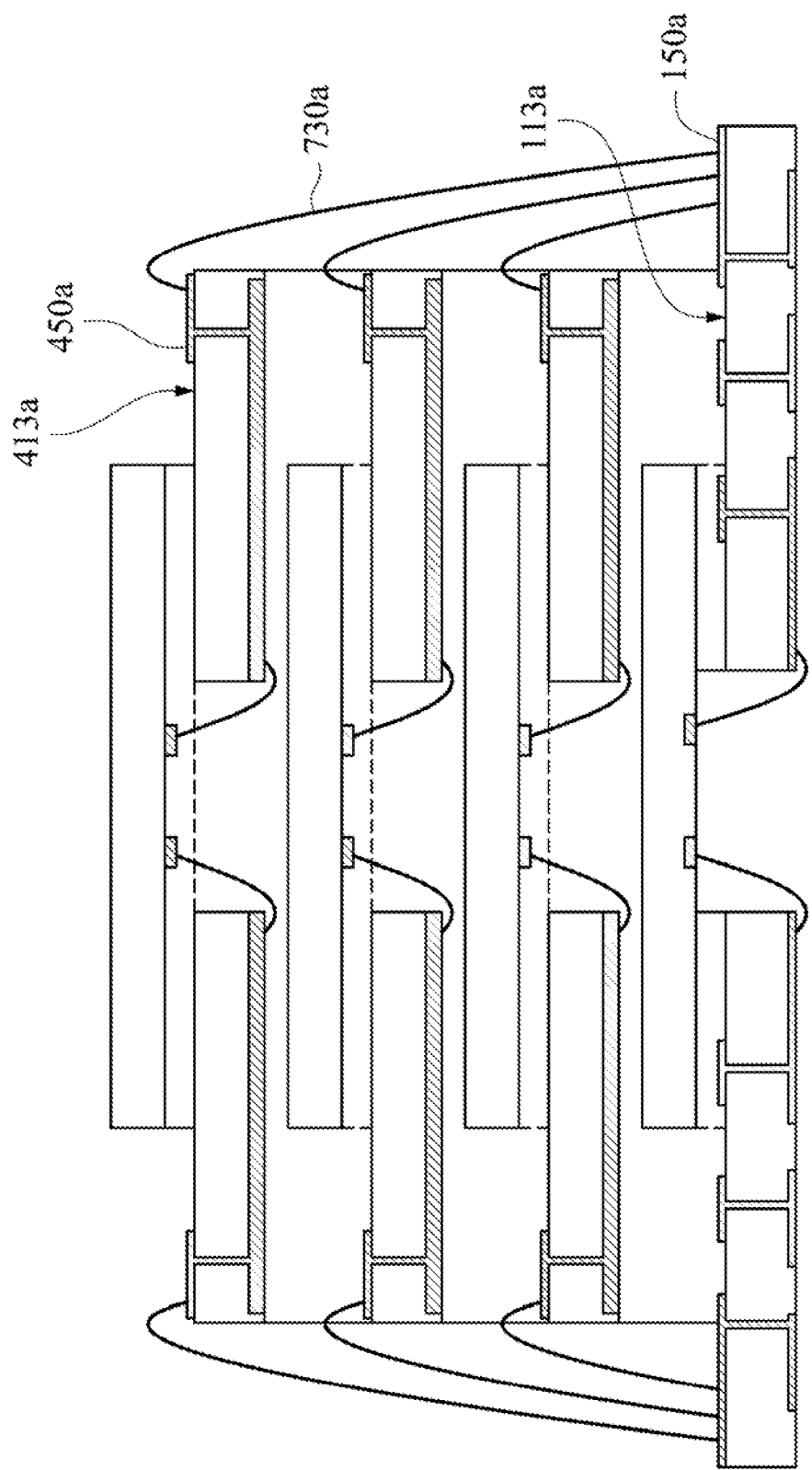

Referring to FIG. 24 and FIG. 25, thereafter, the fourth substrate 410a is attached to the third substrate 310a and the third semiconductor chip 320a on top of the structure in FIG. 20. The step is performed by attaching the sixth adhesive layer 860a in between. Thereafter, the first top conductive foil 150a located on the first surface 113a of the first substrate 110a electrically connects, by the seventh bonding wire 730a, to the fourth top conductive foil 450a located on the first surface 413a of the fourth substrate 410a.

Figure 26:
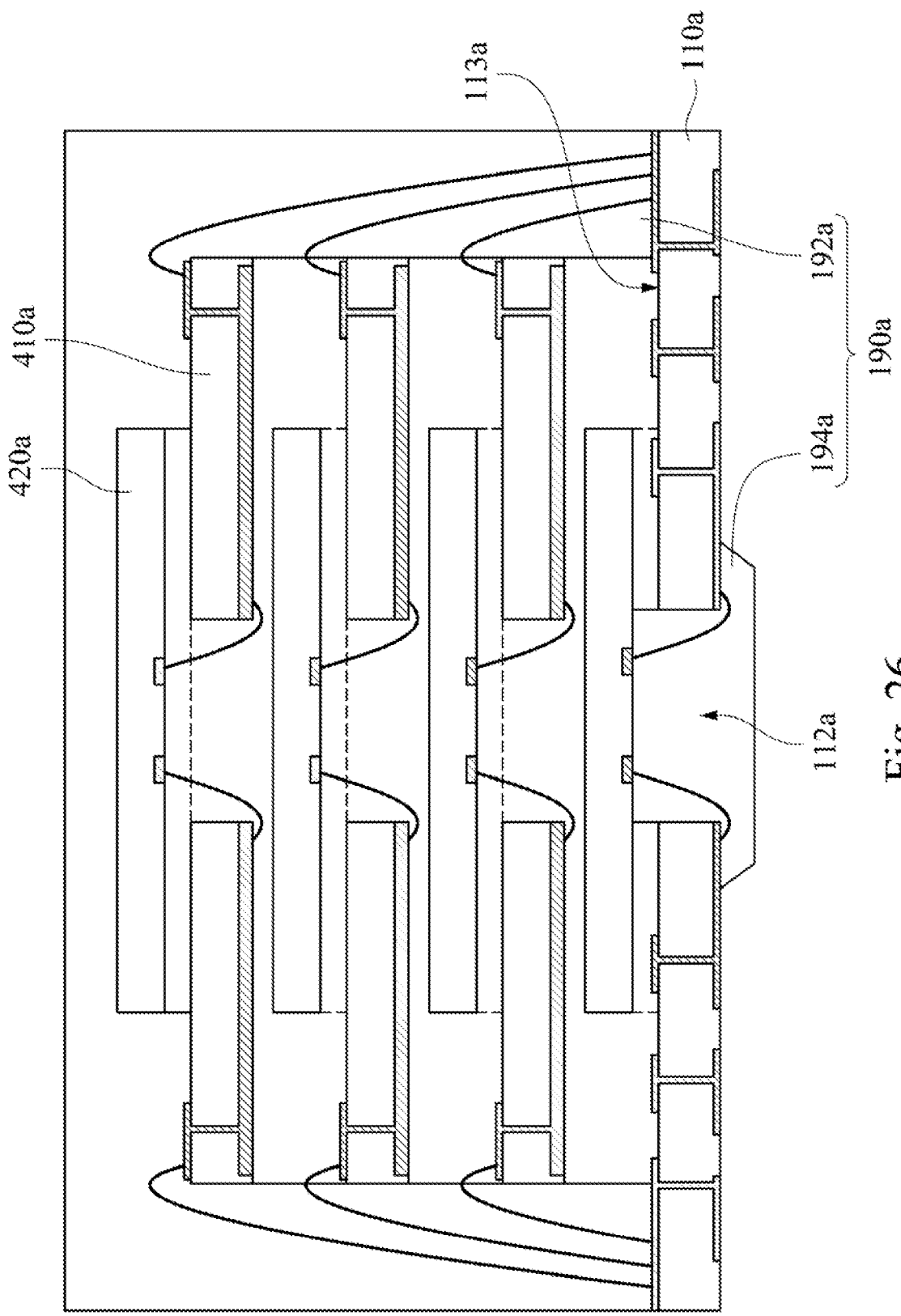

Referring to FIG. 15 and FIG. 26, thereafter, the first portion 192a of the molding compound 190a on the first surface 113a of the first substrate 110a and the second portion 194a of the molding compound 190a located in the window 112a of the first substrate 110a is formed. The first portion 192a of the molding compound 190a covers the fourth substrate 410a and the fourth semiconductor chip 420a, and the second portion 194a of the molding compound 190a extends to the second surface 111a of the first substrate 110a. In some embodiments, the first portion 192a and the second portion 194a of the molding compound 190 are formed at the same time. The shape of the molding compound 190 is determined by the shape of a mold. In other words, the first portion 192a and the second portion 194a of the molding compound 190 are simultaneously formed in one molding step. Thereafter, a solder ball 180a is soldered to a conductive region 170a such that the solder ball 180a electrically connects to the conductive via 160a. The method used in the soldering of the solder ball 180 can be solder reflowing, but not limited to it. After the last step, the semiconductor package 100a of FIG. 15 is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first substrate having a window through a center portion of the first substrate;
    a first semiconductor chip located on the first substrate, wherein the first semiconductor chip has a bonding pad;
    a first bonding wire in the window of the first substrate and electrically connected to the bonding pad of the first semiconductor chip and the first substrate;
    a second substrate located on the first semiconductor chip, and having a window through a center portion of the second substrate, wherein the second substrate electrically connects to the first substrate;
    a second semiconductor chip located on the second substrate, wherein the second semiconductor chip has a bonding pad;
    a second bonding wire in the window of the second substrate and electrically connected to the bonding pad of the second semiconductor chip and the second substrate; and
    an adhesive structure located on a top surface of the first substrate and extends to a bottom surface of the second semiconductor chip, wherein the adhesive structure comprises a first adhesive layer located between the first substrate and the first semiconductor chip, a second adhesive layer between the first substrate and the second substrate, between the first semiconductor chip and the second substrate, and in the window of the second substrate, and a third adhesive layer between the second substrate and the second semiconductor chip.

2. The semiconductor package of claim 1, further comprising:
    a molding compound having a first portion and a second portion, wherein the first portion of the molding compound is located on the top surface of the first substrate and covering the second substrate and the second semiconductor chip, and the second portion of the molding compound is located in the window of the first substrate and extends to a bottom surface of the first substrate.

3. The semiconductor package of claim 1, further comprising:
    a first bottom conductive foil located on a bottom surface of the first substrate, wherein the first bottom conductive foil electrically connects to the bonding pad of the first semiconductor chip through the first bonding wire; and
    a second bottom conductive foil located on a bottom surface of the second substrate, wherein the second bottom conductive foil electrically connects to the bonding pad of the second semiconductor chip through the second bonding wire.

4. The semiconductor package of claim 3, further comprising:
    a first top conductive foil located on the top surface of the first substrate;
    a second top conductive foil located on a top surface of the second substrate; and
    a third bonding wire electrically connected to the second top conductive foil and the first top conductive foil.

5. The semiconductor package of claim 4, wherein the first substrate further comprises:
    a conductive via located in the first substrate and through the top surface of the first substrate and the bottom surface of the first substrate, wherein the conductive via electrically connects to the first bottom conductive foil and the first top conductive foil;
    a conductive region located on the bottom surface of the first substrate and electrically connected to a bottom end of the conductive via; and
    a solder ball located on the conductive region.

6. The semiconductor package of claim 4, wherein the second substrate further comprises:
    a conductive via located in the second substrate and through the top surface of the second substrate and the bottom surface of the second substrate, wherein the conductive via electrically connects to the second bottom conductive foil and the second top conductive foil.

7. The semiconductor package of claim 1, wherein the second adhesive layer of the adhesive structure surrounds the first semiconductor chip and has an edge aligned with an edge of the second substrate.

8. The semiconductor package of claim 1, further comprising:
    a third substrate located on the second semiconductor chip, and having a window through a center portion of the third substrate, wherein the third substrate electrically connects to the first substrate;
    a third semiconductor chip located on the third substrate, wherein the third semiconductor chip has a bonding pad;
    a fourth bonding wire in the window of the third substrate and electrically connected to the bonding pad of the third semiconductor chip and the third substrate;
    a fourth substrate located on the third semiconductor chip, and having a window through a center portion of the fourth substrate, wherein the fourth substrate electrically connects to the first substrate;
    a fourth semiconductor chip located on the fourth substrate, wherein the fourth semiconductor chip has a bonding pad; and
    a fifth bonding wire in the window of the fourth substrate and electrically connected to the bonding pad of the fourth semiconductor chip and the fourth substrate.

9. The semiconductor package of claim 8, further comprising:
    a third bottom conductive foil located on a bottom surface of the third substrate, wherein the third bottom conductive foil electrically connects to the bonding pad of the third semiconductor chip through the fourth bonding wire; and
    a fourth bottom conductive foil located on a bottom surface of the fourth substrate, wherein the fourth bottom conductive foil electrically connects to the bonding pad of the fourth semiconductor chip through the fifth bonding wire.

10. The semiconductor package of claim 9, further comprising:
    a third top conductive foil located on a top surface of the third substrate, wherein the third top conductive foil electrically connects to the first substrate through a sixth bonding wire; and
    a conductive via located in the third substrate and through the top surface of the third substrate and the bottom surface of the third substrate, wherein the conductive via electrically connects to the third bottom conductive foil and the third top conductive foil.

11. The semiconductor package of claim 9, further comprising:

a fourth top conductive foil located on a top surface of the fourth substrate, wherein the fourth top conductive foil electrically connects to the first substrate through a seventh bonding wire; and a conductive via located in the fourth substrate and through the top surface of the fourth substrate and the bottom surface of the fourth substrate, wherein the conductive via electrically connects to the fourth bottom conductive foil and the fourth top conductive foil.

12. The semiconductor package of claim 8, wherein the adhesive structure is located on the top surface of the first substrate and extends to a bottom surface of the fourth semiconductor chip, wherein the adhesive structure further comprises a fourth adhesive layer between the second substrate and the third substrate, between the second semiconductor chip and the third substrate, and in the window of the third substrate, a fifth adhesive layer between the third substrate and the third semiconductor chip, a sixth adhesive layer between the third substrate and the fourth substrate, between the third semiconductor chip and the fourth substrate, and in the window of the fourth substrate, and a seventh adhesive layer between the fourth substrate and the fourth semiconductor chip.

13. The semiconductor package of claim 12, wherein the second adhesive layer of the adhesive structure surrounds the first semiconductor chip and has an edge aligned with an edge of the second substrate, the fourth adhesive layer of the adhesive structure surrounds the second semiconductor chip and has an edge aligned with an edge of the third substrate, and the sixth adhesive layer of the adhesive structure surrounds the third semiconductor chip and has an edge aligned with an edge of the fourth substrate.

14. A manufacturing method of a semiconductor package, comprising:

forming a window through a center portion of a first substrate;

attaching a first surface of the first substrate to a first surface of a first semiconductor chip;

electrically connecting, by a first bonding wire, a bonding pad of the first semiconductor chip to a first bottom conductive foil that is on a second surface of the first substrate opposite the first surface of the first substrate, such that the first bonding wire is located in the window of the first substrate;

forming a window through a center portion of a second substrate;

attaching a first surface of the second substrate to a first surface of a second semiconductor chip;

electrically connecting, by a second bonding wire, a bonding pad of the second semiconductor chip to a second bottom conductive foil that is on a second surface of the second substrate opposite the first surface of the second substrate, such that the second bonding wire is located in the window of the second substrate;

attaching the second substrate to the first substrate and the first semiconductor chip;

electrically connecting, by a third bonding wire, a first top conductive foil on the first surface of the first substrate and a second top conductive foil on the first surface of the second substrate; and forming a first portion of a molding compound on the first surface of the first substrate and a second portion of the molding compound in the window of the first substrate, wherein the first portion of the molding compound covers the second substrate and the second semiconductor chip, and the second portion of the molding compound extends to the second surface of the first substrate.

15. The manufacturing method of the semiconductor package of claim 14, wherein the first substrate comprises a conductive via in the first substrate and a conductive region on the second surface of the first substrate, and the manufacturing method further comprises:

soldering a solder ball to the conductive region such that the solder ball electrically connects to the conductive via.

16. The manufacturing method of the semiconductor package of claim 14, further comprises: before forming the molding compound, forming a window through a center portion of a third substrate;

attaching a first surface of the third substrate to a first surface of a third semiconductor chip;

electrically connecting, by a fourth bonding wire, a bonding pad of the third semiconductor chip to a third bottom conductive foil on a second surface of the third substrate opposite the first surface of the third substrate, such that the fourth bonding wire is located in the window of the third substrate;

attaching the third substrate to the second substrate and the second semiconductor chip;

electrically connecting the first substrate to the third substrate;

forming a window through a center portion of a fourth substrate;

attaching a first surface of the fourth substrate to a first surface of a fourth semiconductor chip;

electrically connecting, by a fifth bonding wire, a bonding pad of the fourth semiconductor chip to a fourth bottom conductive foil on a second surface of the fourth substrate opposite the first surface of the fourth substrate, such that the fifth bonding wire is located in the window of the fourth substrate;

attaching the fourth substrate to the third substrate and the third semiconductor chip; and electrically connecting the first substrate and the fourth substrate.

17. The manufacturing method of the semiconductor package of claim 16, further comprising:

electrically connecting, by a sixth bonding wire, a third top conductive foil located on the first surface of the third substrate to the first top conductive foil on the first surface of the first substrate.

18. The manufacturing method of the semiconductor package of claim 16, further comprising:

electrically connecting, by a seventh bonding wire, a fourth top conductive foil on the first surface of the fourth substrate to the first top conductive foil on the first surface of the first substrate.

* * * * *